US012621081B2

(12) United States Patent　　　　(10) Patent No.:　US 12,621,081 B2
Hong et al.　　　　　　　　　　　(45) Date of Patent:　　　May 5, 2026

(54) METHODS AND PROCEDURES FOR POLAR ENCODING AND DECODING WITH LOW LATENCY

(71) Applicant: InterDigital Patent Holdings, Inc., Wilmington, DE (US)

(72) Inventors: Sungkwon Hong, Seoul (KR); Onur Sahin, London (GB)

(73) Assignee: InterDigital Patent Holdings, Inc., Wilmington, DE (US)

( * ) Notice: Subject to any disclaimer, the term of this patent is extended or adjusted under 35 U.S.C. 154(b) by 0 days.

(21) Appl. No.: 18/543,828

(22) Filed: Dec. 18, 2023

(65) Prior Publication Data

US 2024/0129063 A1　　Apr. 18, 2024

Related U.S. Application Data

(63) Continuation of application No. 17/310,249, filed as application No. PCT/US2020/015714 on Jan. 29, 2020, now Pat. No. 11,848,778.

(Continued)

(51) Int. Cl.
　　H04L 1/00　　　　(2006.01)
　　H03M 13/13　　　(2006.01)
　　H03M 13/27　　　(2006.01)
(52) U.S. Cl.
　　CPC .......... H04L 1/0072 (2013.01); H03M 13/13 (2013.01); H03M 13/27 (2013.01); H04L 1/0041 (2013.01);
(Continued)
(58) Field of Classification Search
　　CPC ...... H03M 13/05; H03M 13/13; H03M 13/27; H03M 13/6525; H04L 1/0041;
(Continued)

(56) References Cited

U.S. PATENT DOCUMENTS 9,176,927 B2 * 11/2015 Gross .................... H03M 13/13
9,397,706 B1 * 7/2016 Steiner .................. H03M 13/45
(Continued)

FOREIGN PATENT DOCUMENTS

EP　　　　3 073 660　　　9/2016

OTHER PUBLICATIONS

Arikan, "Channel Polarization: A Method for Constructing Capacity-Achieving Codes for Symmetric Binary-Input Memoryless Channels," IEEE Transactions on Information Theory, vol. 55, No. 7, pp. 3051-3073 (Jul. 2009).

(Continued)

*Primary Examiner* — Shelly A Chase
(74) *Attorney, Agent, or Firm* — Volpe Koenig

(57)　　　　　ABSTRACT

A polar code may be initially divided into multiple polar component codes where the features of these component codes, such as the number of component codes and the size of the component codes, are determined based on parameters such as the number of available timing units within a transmission interval, interleaving depth, and decoder capability. For each selected component code, the order of code bit generation and their indexes may be determined. The determined indexes may be assigned into different, unique groups according to the order of code bit generation. An interleaving operation may be configured and then executed according to the determined index grouping. In the transmission phase, the code bits may be transmitted based on the identified order of the bit generation in the component polar codes, such as the determined index grouping.

16 Claims, 14 Drawing Sheets

Related U.S. Application Data

(60) Provisional application No. 62/798,208, filed on Jan. 29, 2019.

(52) U.S. Cl.
CPC .......... *H04L 1/0046* (2013.01); *H04L 1/0057* (2013.01); *H04L 1/0071* (2013.01)

(58) Field of Classification Search
CPC ... H04L 1/0046; H04L 1/0057; H04L 1/0061; H04L 1/0071; H04L 1/0072
See application file for complete search history.

(56) References Cited

U.S. PATENT DOCUMENTS

| | | | |
|---|---|---|---|
| 2016/0204811 A1* | 7/2016 | Goela | H04B 1/123 |
| | | | 375/260 |
| 2017/0012740 A1 | 1/2017 | Shen et al. | |
| 2017/0338996 A1 | 11/2017 | Sankar et al. | |
| 2017/0366205 A1 | 12/2017 | Zhang et al. | |
| 2018/0278369 A1 | 9/2018 | Ge et al. | |
| 2019/0229752 A1* | 7/2019 | Saber | H03M 13/2906 |
| 2020/0059245 A1 | 2/2020 | Zhang et al. | |
| 2021/0021844 A1 | 1/2021 | Hui et al. | |

OTHER PUBLICATIONS

Arikan, "Polar Codes: A Pipelined Implementation," 4th International Symposium on Broadband Communication, Melaka, Malaysia (Jul. 11-14, 2010).
Cammerer et al., "Sparse Graphs for Belief Propagation Decoding of Polar Codes," 2018 IEEE International Symposium on Information Theory (ISIT), Vail, CO, USA, pp. 1465-1469 (2018).
Draft Standard for Information Technology—Telecommunications and Information Exchange Between Systems—Local and Metropolitan Area Networks—Specific Requirements—Part 11: Wireless LAN Medium Access Channel (MAC) and Physical Layer (PHY) Specifications—Amendment 7: Enhanced throughput for operation in license-exempt bands above 45 GHz, IEEE P802.11ay/D2.1 (Oct. 2018).
Huawei et al., "Details of the Polar code design," 3GPP TSG RAN WG1 Meeting #87, R1-1611254, Reno, USA (Nov. 10-14, 2016).
IEEE Standard for Information technology—Telecommunications and information exchange between systems—Local and metropolitan area networks—Specific requirements; Part 11: Wireless LAN Medium Access Control (MAC) and Physical Layer (PHY) Specifications, IEEE Std. 802.11-2016 (Dec. 7, 2016).
IEEE Standard for Information technology—Telecommunications and information exchange between systems—Local and metropolitan area networks—Specific requirements; Part 11: Wireless LAN Medium Access Control (MAC) and Physical Layer (PHY) Specifications; Amendment 4: Enhancements for Very High Throughput for Operation in Bands below 6GHZ, IEEE Std 802.11ac-2013 (Dec. 11, 2013).
IEEE Standard for Information Technology—Telecommunications and information exchange between systems—Local and metropoli-
tan area networks—Specific requirements; Part 11: Wireless LAN Medium Access Control (MAC) and Physical Layer (PHY) specifications; Amendment 5: Television White Spaces (TVWS) Operation, IEEE 802.11af-2013 (Dec. 11, 2013).
IEEE Standard for Information technology—Telecommunications and information exchange between systems—Local and metropolitan area networks—Specific requirements; Part 11: Wireless LAN Medium Access Control (MAC) and Physical Layer (PHY) Specifications; Amendment 5: Enhancements for Higher Throughput, IEEE Std 802.11n-2009 (Sep. 2009).
IEEE Standard for Information technology—Telecommunications and information exchange between systems Local and metropolitan area networks—Specific requirements; Part 11: Wireless LAN Medium Access Control (MAC) and Physical Layer (PHY) Specifications; Amendment 2: Sub 1 GHz License Exempt Operation, IEEE 802.11ah-2016 (Dec. 7, 2016).
Kschichang et al., "Factor graphs and the sum-product algorithm," IEEE Transactions on Information Theory, vol. 47, No. 2, pp. 498-519 (Feb. 2001).
LG Electronics, Discussion on frame structure for NR, 3GPP TSG RAN WG1 Meeting #85, R1-164560, pp. 1 to 8, (retrieved Jan. 25, 2023). (Year: 2016).
Mediatek Inc., "Resolving Polar Code Memory Complexity Issue," 3GPP TSG RAN WG1 Meeting #86bis, R1-1609338, Lisbon, Portugal (Oct. 10-14, 2016).
Mishra et al., "A successive cancellation decoder ASIC for a 1024-bit polar code in 180nm CMOS," 2012 IEEE Asian Solid State Circuits Conference (A-SSCC), pp. 205-208 (2012).
Niu et al., "CRC-Aided Decoding of Polar Codes," IEEE Communications Letters, vol. 16, No. 10, pp. 1668-1671, Oct. 2012.
NTT Docomo, "Channel interleaving design of Polar codes," 3GPP TSG RAN WG1 Meeting #90, R1-1713968, Prague, Czech Republic (Aug. 21-25, 2017).
Pyndiah, "Near-optimum decoding of product codes: block turbo codes," IEEE Transactions on Communications, vol. 46, No. 8, pp. 1003-1010 (Aug. 1998).
Tal et al., "How to Construct Polar Codes," IEEE Transactions on Information Theory, vol. 59, No. 10 (Oct. 2013).
Tal et al., "List Decoding of Polar Codes," arXiv:1206.0050v1 [cs.IT] (May 31, 2012).
Third Generation Partnership Project, "Technical Specification Group Radio Access Network; NR; Multiplexing and channel coding (Release 15)," 3GPP TS 38.212 V15.0.0 (Dec. 2017).
Third Generation Partnership Project, "Technical Specification Group Radio Access Network; NR; Multiplexing and channel coding (Release 15)," 3GPP TS 38.212 V15.4.0 (Dec. 2018).
Third Generation Partnership Project, "Technical Specification Group Radio Access Network; NR; Multiplexing and channel coding (Release 15)," 3GPP TS 38.212 V15.8.0 (Dec. 2019).
Third Generation Partnership Project, "Technical Specification Group Radio Access Network; NR; Multiplexing and channel coding (Release 16)," 3GPP TS 38.212 V16.0.0 (Dec. 2019).
Vangala et al., "A Comparative Study of Polar Code Constructions for the AWGN Channel," arXiv:1501.02473v1 [cs.IT] (Jan. 11, 2015).

* cited by examiner

METHODS AND PROCEDURES FOR POLAR ENCODING AND DECODING WITH LOW LATENCY

CROSS-REFERENCE TO RELATED APPLICATIONS

This application is a continuation of U.S. patent application Ser. No. 17/310,249 filed Jul. 27, 2021, which will issue as U.S. Pat. No. 11,848,778 on Dec. 19, 2023, which is the U.S. National Stage, under 35 U.S.C. § 371, of International Application No. PCT/US2020/015714 filed on Jan. 29, 2020 which claims the benefit of U.S. Provisional Application No. 62/798,208, filed Jan. 29, 2019, the contents of which are hereby incorporated herein by reference.

BACKGROUND

Polar codes are the first channel code type analytically proven to be capacity achieving. Polar codes show comparable performance to conventional LDPC code or turbo code with low or no error floor when aided by the embedded CRC, particularly for small to medium block lengths. Polar codes with successive cancellation decoding requires relatively low encoding and decoding complexities. However, the decoding complexity and latency may increase in proportion to the list-size when the CRC-aided list decoding is adopted as well as the block-length of the codeword. The complexity and latency increase becomes a central issue particularly in medium to large block-lengths, and limits the adoption of polar codes for high throughput regime including 5G NR eMBB data rates (~20 Gbps) and above.

SUMMARY

A polar code may be initially divided into multiple polar component codes where the features of these component codes, such as the number of component codes and the size of the component codes, are determined based on parameters such as the number of available timing units within a transmission interval, interleaving depth, and decoder capability. For each selected component code, the order of code bit generation and their indexes may be determined. The determined indexes may be assigned into different, unique groups according to the order of code bit generation. An interleaving operation may be configured and then executed according to the determined index grouping. In the transmission phase, the code bits may be transmitted based on the identified order of the bit generation in the component polar codes, such as the determined index grouping. In the receiver, the decoder may start its decoding process of the received channel symbols utilizing the order of the transmission information made available to itself a priori, and therefore the decoding process may star before receiving all channel symbols.

BRIEF DESCRIPTION OF THE DRAWINGS

A more detailed understanding may be had from the following description, given by way of example in conjunction with the accompanying drawings, wherein like reference numerals in the figures indicate like elements, and wherein.

DETAILED DESCRIPTION

Figure 1A:
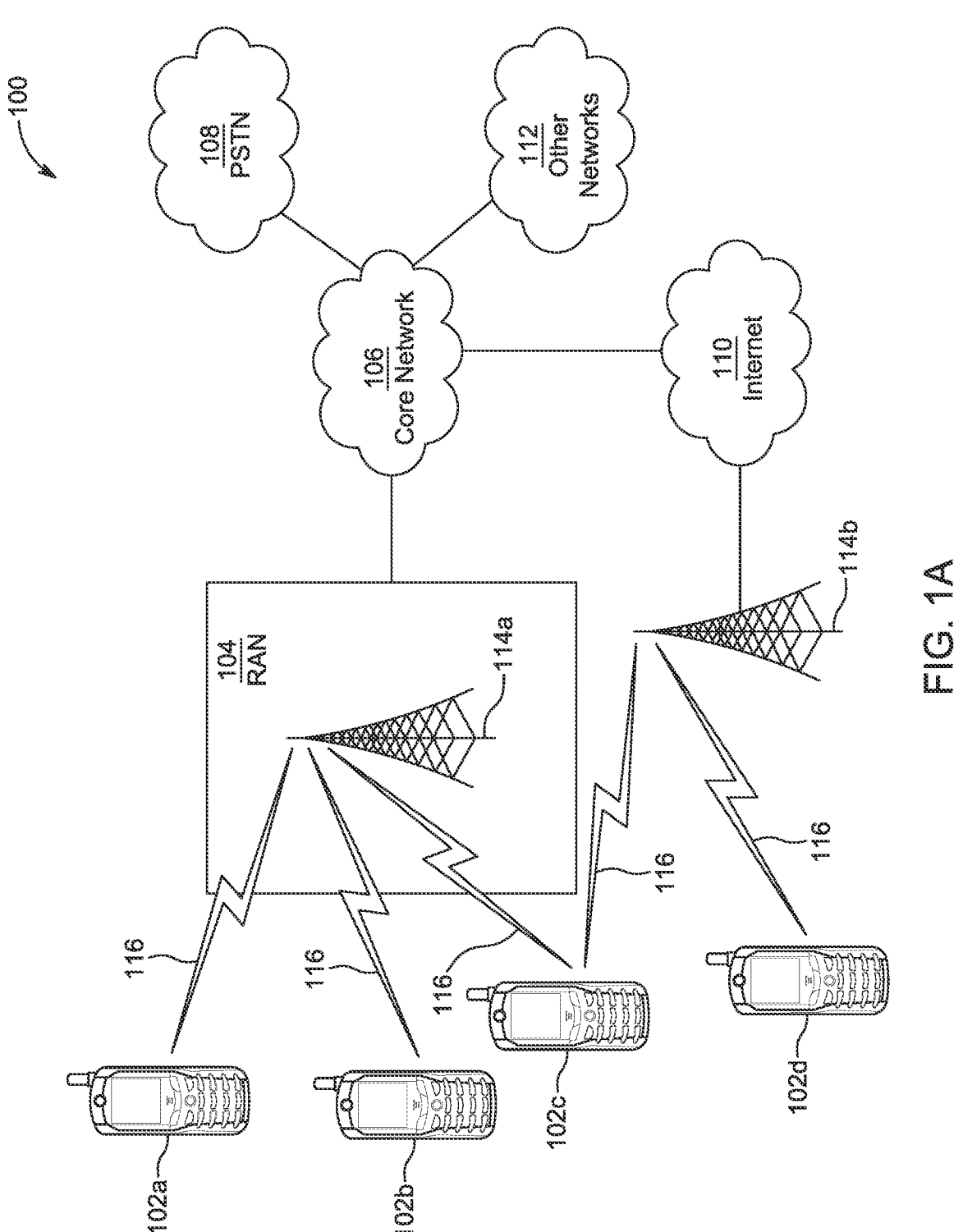
FIG. 1A is a system diagram illustrating an example communications system in which one or more disclosed embodiments may be implemented.

FIG. 1A is a diagram illustrating an example communications system 100 in which one or more disclosed embodiments may be implemented. The communications system 100 may be a multiple access system that provides content, such as voice, data, video, messaging, broadcast, etc., to multiple wireless users. The communications system 100 may enable multiple wireless users to access such content through the sharing of system resources, including wireless bandwidth. For example, the communications systems 100 may employ one or more channel access methods, such as code division multiple access (CDMA), time division multiple access (TDMA), frequency division multiple access (FDMA), orthogonal FDMA (OFDMA), single-carrier FDMA (SC-FDMA), zero-tail unique-word discrete Fourier transform Spread OFDM (ZT-UW-DFT-S-OFDM), unique word OFDM (UW-OFDM), resource block-filtered OFDM, filter bank multicarrier (FBMC), and the like.

As shown in FIG. 1A, the communications system 100 may include wireless transmit/receive units (WTRUs) 102*a*, 102*b*, 102*c*, 102*d*, a radio access network (RAN) 104, a core network (CN) 106, a public switched telephone network (PSTN) 108, the Internet 110, and other networks 112, though it will be appreciated that the disclosed embodiments contemplate any number of WTRUs, base stations, networks, and/or network elements. Each of the WTRUs 102*a*, 102*b*, 102*c*, 102*d* may be any type of device configured to operate and/or communicate in a wireless environment. By way of example, the WTRUs 102*a*, 102*b*, 102*c*, 102*d*, any of which may be referred to as a station (STA), may be configured to transmit and/or receive wireless signals and may include a user equipment (UE), a mobile station, a fixed or mobile subscriber unit, a subscription-based unit, a pager, a cellular telephone, a personal digital assistant (PDA), a smartphone, a laptop, a netbook, a personal computer, a wireless sensor, a hotspot or Mi-Fi device, an Internet of Things (IoT) device, a watch or other wearable, a head-mounted display (HMD), a vehicle, a drone, a medical device and applications (e.g., remote surgery), an industrial device and applications (e.g., a robot and/or other wireless devices operating in an industrial and/or an automated processing chain contexts), a consumer electronics device, a device operating on commercial and/or industrial wireless networks, and the like. Any of the WTRUs 102*a*, 102*b*, 102*c* and 102*d* may be interchangeably referred to as a UE.

The communications systems 100 may also include a base station 114*a* and/or a base station 114*b*. Each of the base stations 114*a*, 114*b* may be any type of device configured to wirelessly interface with at least one of the WTRUs 102*a*, 102*b*, 102*c*, 102*d* to facilitate access to one or more communication networks, such as the CN 106, the Internet 110, and/or the other networks 112. By way of example, the base stations 114*a*, 114*b* may be a base transceiver station (BTS), a NodeB, an eNode B (eNB), a Home Node B, a Home eNode B, a next generation NodeB, such as a gNode B (gNB), a new radio (NR) NodeB, a site controller, an access point (AP), a wireless router, and the like. While the base stations 114*a*, 114*b* are each depicted as a single element, it will be appreciated that the base stations 114*a*, 114*b* may include any number of interconnected base stations and/or network elements.

The base station 114*a* may be part of the RAN 104, which may also include other base stations and/or network elements (not shown), such as a base station controller (BSC), a radio network controller (RNC), relay nodes, and the like. The base station 114*a* and/or the base station 114*b* may be configured to transmit and/or receive wireless signals on one or more carrier frequencies, which may be referred to as a cell (not shown). These frequencies may be in licensed spectrum, unlicensed spectrum, or a combination of licensed and unlicensed spectrum. A cell may provide coverage for a wireless service to a specific geographical area that may be relatively fixed or that may change over time. The cell may further be divided into cell sectors. For example, the cell associated with the base station 114*a* may be divided into three sectors. Thus, in one embodiment, the base station 114*a* may include three transceivers, i.e., one for each sector of the cell. In an embodiment, the base station 114*a* may employ multiple-input multiple output (MIMO) technology and may utilize multiple transceivers for each sector of the cell. For example, beamforming may be used to transmit and/or receive signals in desired spatial directions.

The base stations 114*a*, 114*b* may communicate with one or more of the WTRUs 102*a*, 102*b*, 102*c*, 102*d* over an air interface 116, which may be any suitable wireless communinication link (e.g., radio frequency (RF), microwave, centimeter wave, micrometer wave, infrared (IR), ultraviolet (UV), visible light, etc.). The air interface 116 may be established using any suitable radio access technology (RAT).

More specifically, as noted above, the communications system 100 may be a multiple access system and may employ one or more channel access schemes, such as CDMA, TDMA, FDMA, OFDMA, SC-FDMA, and the like. For example, the base station 114*a* in the RAN 104 and the WTRUs 102*a*, 102*b*, 102*c* may implement a radio technology such as Universal Mobile Telecommunications System (UMTS) Terrestrial Radio Access (UTRA), which may establish the air interface 116 using wideband CDMA (WCDMA). WCDMA may include communication protocols such as High-Speed Packet Access (HSPA) and/or Evolved HSPA (HSPA+). HSPA may include High-Speed Downlink (DL) Packet Access (HSDPA) and/or High-Speed Uplink (UL) Packet Access (HSUPA).

In an embodiment, the base station 114*a* and the WTRUs 102*a*, 102*b*, 102*c* may implement a radio technology such as Evolved UMTS Terrestrial Radio Access (E-UTRA), which may establish the air interface 116 using Long Term Evolution (LTE) and/or LTE-Advanced (LTE-A) and/or LTE-Advanced Pro (LTE-A Pro).

In an embodiment, the base station 114*a* and the WTRUs 102*a*, 102*b*, 102*c* may implement a radio technology such as NR Radio Access, which may establish the air interface 116 using NR.

In an embodiment, the base station 114*a* and the WTRUs 102*a*, 102*b*, 102*c* may implement multiple radio access technologies. For example, the base station 114*a* and the WTRUs 102*a*, 102*b*, 102*c* may implement LTE radio access and NR radio access together, for instance using dual connectivity (DC) principles. Thus, the air interface utilized by WTRUs 102*a*, 102*b*, 102*c* may be characterized by multiple types of radio access technologies and/or transmissions sent to/from multiple types of base stations (e.g., an eNB and a gNB).

In other embodiments, the base station 114*a* and the WTRUs 102*a*, 102*b*, 102*c* may implement radio technologies such as IEEE 802.11 (i.e., Wireless Fidelity (WiFi), IEEE 802.16 (i.e., Worldwide Interoperability for Microwave Access (WiMAX)), CDMA2000, CDMA2000 1×, CDMA2000 EV-DO, Interim Standard 2000 (IS-2000), Interim Standard 95 (IS-95), Interim Standard 856 (IS-856), Global System for Mobile communications (GSM), Enhanced Data rates for GSM Evolution (EDGE), GSM EDGE (GERAN), and the like.

The base station 114*b* in FIG. 1A may be a wireless router, Home Node B, Home eNode B, or access point, for example, and may utilize any suitable RAT for facilitating wireless connectivity in a localized area, such as a place of business, a home, a vehicle, a campus, an industrial facility, an air corridor (e.g., for use by drones), a roadway, and the like. In one embodiment, the base station 114*b* and the WTRUs 102*c*, 102*d* may implement a radio technology such as IEEE 802.11 to establish a wireless local area network (WLAN). In an embodiment, the base station 114*b* and the WTRUs 102*c*, 102*d* may implement a radio technology such as IEEE 802.15 to establish a wireless personal area network (WPAN). In yet another embodiment, the base station 114*b* and the WTRUs 102*c*, 102*d* may utilize a cellular-based RAT (e.g., WCDMA, CDMA2000, GSM, LTE, LTE-A, LTE-A Pro, NR etc.) to establish a picocell or femtocell. As shown in FIG. 1A, the base station 114*b* may have a direct connection to the Internet 110. Thus, the base station 114b may not be required to access the Internet 110 via the CN 106.

The RAN 104 may be in communication with the CN 106, which may be any type of network configured to provide voice, data, applications, and/or voice over internet protocol (VoIP) services to one or more of the WTRUs 102a, 102b, 102c, 102d. The data may have varying quality of service (QoS) requirements, such as differing throughput requirements, latency requirements, error tolerance requirements, reliability requirements, data throughput requirements, mobility requirements, and the like. The CN 106 may provide call control, billing services, mobile location-based services, pre-paid calling, Internet connectivity, video distribution, etc., and/or perform high-level security functions, such as user authentication. Although not shown in FIG. 1A, it will be appreciated that the RAN 104 and/or the CN 106 may be in direct or indirect communication with other RANs that employ the same RAT as the RAN 104 or a different RAT. For example, in addition to being connected to the RAN 104, which may be utilizing a NR radio technology, the CN 106 may also be in communication with another RAN (not shown) employing a GSM, UMTS, CDMA 2000, WiMAX, E-UTRA, or WiFi radio technology.

The CN 106 may also serve as a gateway for the WTRUs 102a, 102b, 102c, 102d to access the PSTN 108, the Internet 110, and/or the other networks 112. The PSTN 108 may include circuit-switched telephone networks that provide plain old telephone service (POTS). The Internet 110 may include a global system of interconnected computer networks and devices that use common communication protocols, such as the transmission control protocol (TCP), user datagram protocol (UDP) and/or the internet protocol (IP) in the TCP/IP internet protocol suite. The networks 112 may include wired and/or wireless communications networks owned and/or operated by other service providers. For example, the networks 112 may include another CN connected to one or more RANs, which may employ the same RAT as the RAN 104 or a different RAT.

Some or all of the WTRUs 102a, 102b, 102c, 102d in the communications system 100 may include multi-mode capabilities (e.g., the WTRUs 102a, 102b, 102c, 102d may include multiple transceivers for communicating with different wireless networks over different wireless links). For example, the WTRU 102c shown in FIG. 1A may be configured to communicate with the base station 114a, which may employ a cellular-based radio technology, and with the base station 114b, which may employ an IEEE 802 radio technology.

Figure 1B:
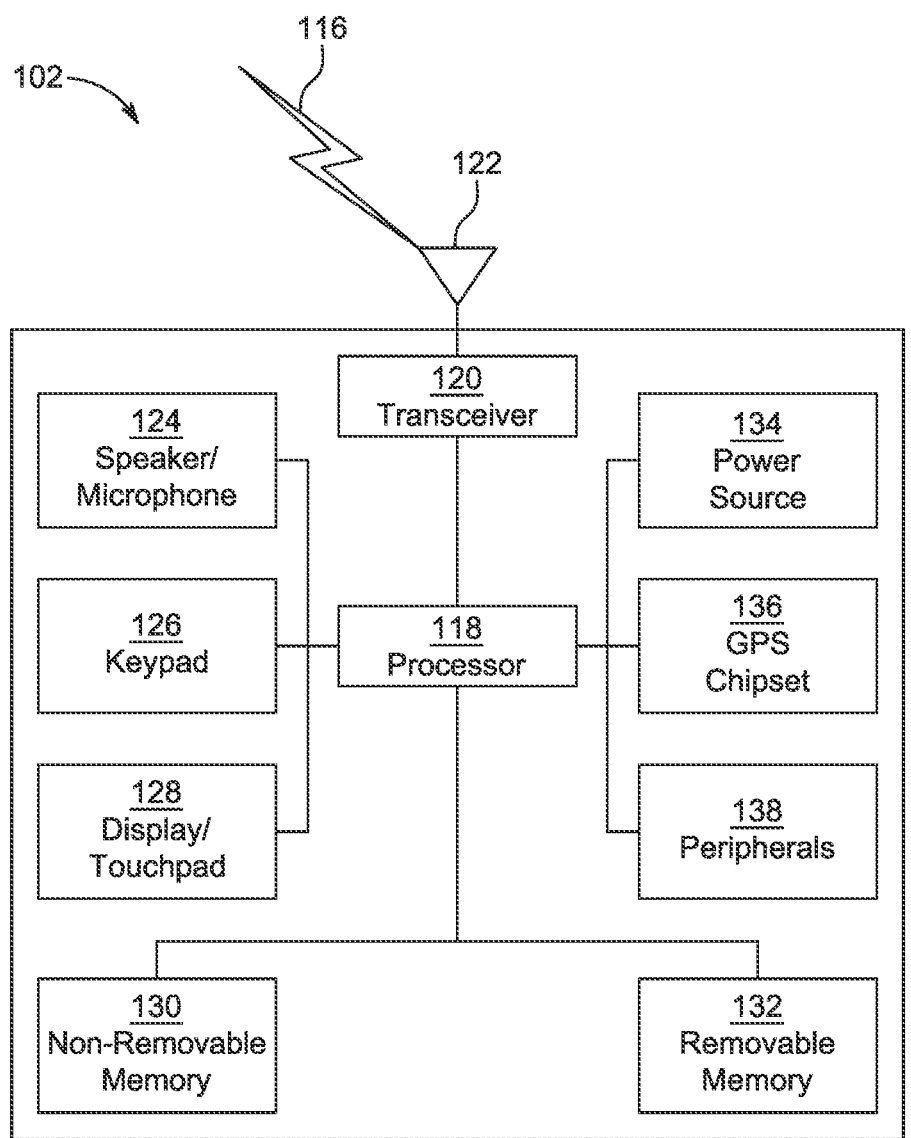
FIG. 1B is a system diagram illustrating an example wireless transmit/receive unit (WTRU) that may be used within the communications system illustrated in FIG. 1A according to an embodiment.

FIG. 1B is a system diagram illustrating an example WTRU 102. As shown in FIG. 1B, the WTRU 102 may include a processor 118, a transceiver 120, a transmit/receive element 122, a speaker/microphone 124, a keypad 126, a display/touchpad 128, non-removable memory 130, removable memory 132, a power source 134, a global positioning system (GPS) chipset 136, and/or other peripherals 138, among others. It will be appreciated that the WTRU 102 may include any sub-combination of the foregoing elements while remaining consistent with an embodiment.

The processor 118 may be a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs), any other type of integrated circuit (IC), a state machine, and the like. The processor 118 may perform signal coding, data processing, power control, input/output processing, and/or any other functionality that enables the WTRU 102 to operate in a wireless environment. The processor 118 may be coupled to the transceiver 120, which may be coupled to the transmit/receive element 122. While FIG. 1B depicts the processor 118 and the transceiver 120 as separate components, it will be appreciated that the processor 118 and the transceiver 120 may be integrated together in an electronic package or chip.

The transmit/receive element 122 may be configured to transmit signals to, or receive signals from, a base station (e.g., the base station 114a) over the air interface 116. For example, in one embodiment, the transmit/receive element 122 may be an antenna configured to transmit and/or receive RF signals. In an embodiment, the transmit/receive element 122 may be an emitter/detector configured to transmit and/or receive IR, UV, or visible light signals, for example. In yet another embodiment, the transmit/receive element 122 may be configured to transmit and/or receive both RF and light signals. It will be appreciated that the transmit/receive element 122 may be configured to transmit and/or receive any combination of wireless signals.

Although the transmit/receive element 122 is depicted in FIG. 1B as a single element, the WTRU 102 may include any number of transmit/receive elements 122. More specifically, the WTRU 102 may employ MIMO technology. Thus, in one embodiment, the WTRU 102 may include two or more transmit/receive elements 122 (e.g., multiple antennas) for transmitting and receiving wireless signals over the air interface 116.

The transceiver 120 may be configured to modulate the signals that are to be transmitted by the transmit/receive element 122 and to demodulate the signals that are received by the transmit/receive element 122. As noted above, the WTRU 102 may have multi-mode capabilities. Thus, the transceiver 120 may include multiple transceivers for enabling the WTRU 102 to communicate via multiple RATs, such as NR and IEEE 802.11, for example.

The processor 118 of the WTRU 102 may be coupled to, and may receive user input data from, the speaker/microphone 124, the keypad 126, and/or the display/touchpad 128 (e.g., a liquid crystal display (LCD) display unit or organic light-emitting diode (OLED) display unit). The processor 118 may also output user data to the speaker/microphone 124, the keypad 126, and/or the display/touchpad 128. In addition, the processor 118 may access information from, and store data in, any type of suitable memory, such as the non-removable memory 130 and/or the removable memory 132. The non-removable memory 130 may include random-access memory (RAM), read-only memory (ROM), a hard disk, or any other type of memory storage device. The removable memory 132 may include a subscriber identity module (SIM) card, a memory stick, a secure digital (SD) memory card, and the like. In other embodiments, the processor 118 may access information from, and store data in, memory that is not physically located on the WTRU 102, such as on a server or a home computer (not shown).

The processor 118 may receive power from the power source 134, and may be configured to distribute and/or control the power to the other components in the WTRU 102. The power source 134 may be any suitable device for powering the WTRU 102. For example, the power source 134 may include one or more dry cell batteries (e.g., nickel-cadmium (NiCd), nickel-zinc (NiZn), nickel metal hydride (NiMH), lithium-ion (Li-ion), etc.), solar cells, fuel cells, and the like.

The processor 118 may also be coupled to the GPS chipset 136, which may be configured to provide location information (e.g., longitude and latitude) regarding the current location of the WTRU 102. In addition to, or in lieu of, the information from the GPS chipset 136, the WTRU 102 may receive location information over the air interface 116 from a base station (e.g., base stations 114a, 114b) and/or determine its location based on the timing of the signals being received from two or more nearby base stations. It will be appreciated that the WTRU 102 may acquire location information by way of any suitable location-determination method while remaining consistent with an embodiment.

The processor 118 may further be coupled to other peripherals 138, which may include one or more software and/or hardware modules that provide additional features, functionality and/or wired or wireless connectivity. For example, the peripherals 138 may include an accelerometer, an e-compass, a satellite transceiver, a digital camera (for photographs and/or video), a universal serial bus (USB) port, a vibration device, a television transceiver, a hands free headset, a Bluetooth® module, a frequency modulated (FM) radio unit, a digital music player, a media player, a video game player module, an Internet browser, a Virtual Reality and/or Augmented Reality (VR/AR) device, an activity tracker, and the like. The peripherals 138 may include one or more sensors. The sensors may be one or more of a gyroscope, an accelerometer, a hall effect sensor, a magnetometer, an orientation sensor, a proximity sensor, a temperature sensor, a time sensor; a geolocation sensor, an altimeter, a light sensor, a touch sensor, a magnetometer, a barometer, a gesture sensor, a biometric sensor, a humidity sensor and the like.

The WTRU 102 may include a full duplex radio for which transmission and reception of some or all of the signals (e.g., associated with particular subframes for both the UL (e.g., for transmission) and DL (e.g., for reception) may be concurrent and/or simultaneous. The full duplex radio may include an interference management unit to reduce and or substantially eliminate self-interference via either hardware (e.g., a choke) or signal processing via a processor (e.g., a separate processor (not shown) or via processor 118). In an embodiment, the WTRU 102 may include a half-duplex radio for which transmission and reception of some or all of the signals (e.g., associated with particular subframes for either the UL (e.g., for transmission) or the DL (e.g., for reception)).

Figure 1C:
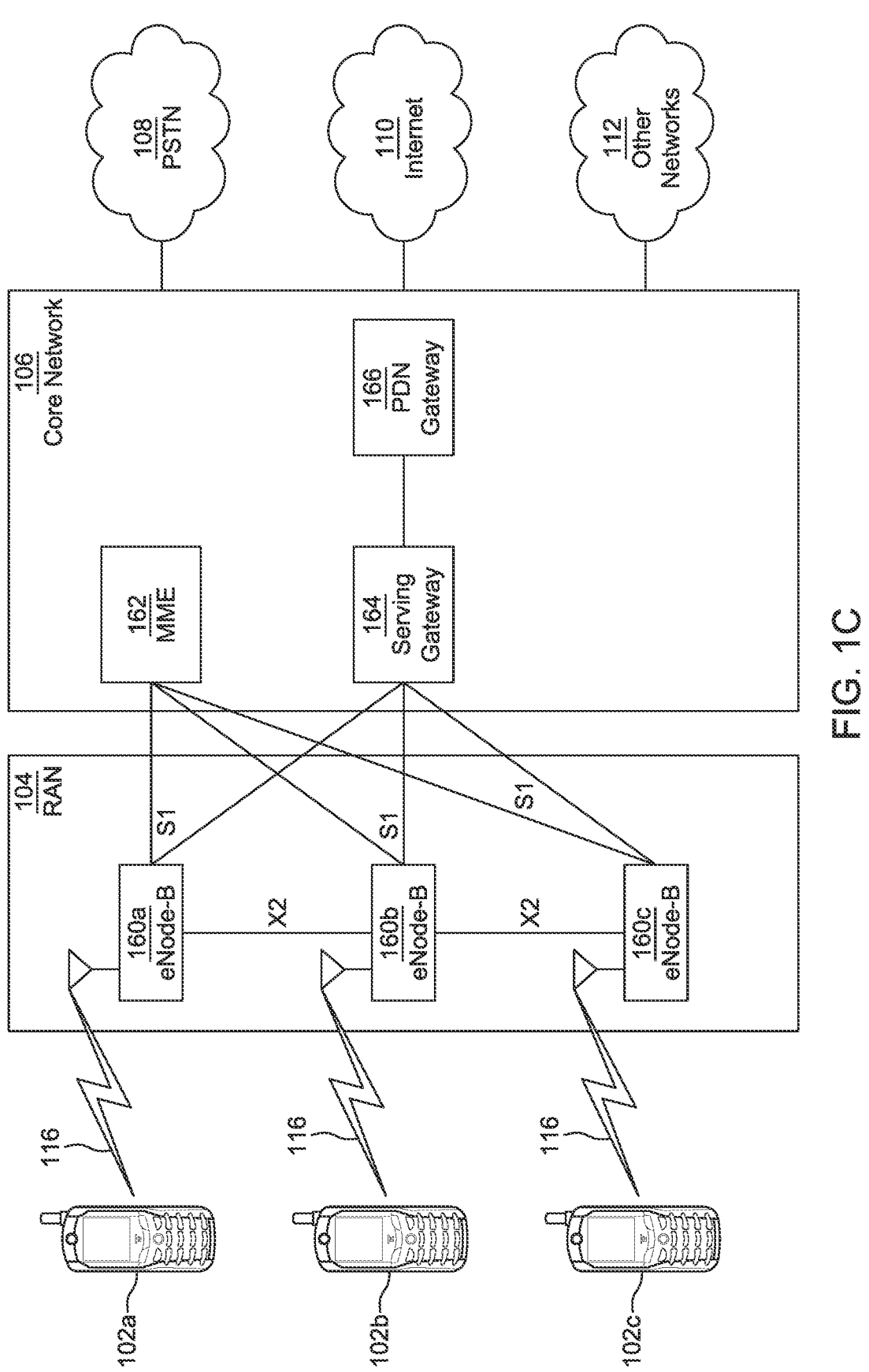
FIG. 1C is a system diagram illustrating an example radio access network (RAN) and an example core network (CN) that may be used within the communications system illustrated in FIG. 1A according to an embodiment.

FIG. 1C is a system diagram illustrating the RAN 104 and the CN 106 according to an embodiment. As noted above, the RAN 104 may employ an E-UTRA radio technology to communicate with the WTRUs 102a, 102b, 102c over the air interface 116. The RAN 104 may also be in communication with the CN 106.

The RAN 104 may include eNode-Bs 160a, 160b, 160c, though it will be appreciated that the RAN 104 may include any number of eNode-Bs while remaining consistent with an embodiment. The eNode-Bs 160a, 160b, 160c may each include one or more transceivers for communicating with the WTRUs 102a, 102b, 102c over the air interface 116. In one embodiment, the eNode-Bs 160a, 160b, 160c may implement MIMO technology. Thus, the eNode-B 160a, for example, may use multiple antennas to transmit wireless signals to, and/or receive wireless signals from, the WTRU 102a.

Each of the eNode-Bs 160a, 160b, 160c may be associated with a particular cell (not shown) and may be configured to handle radio resource management decisions, handover decisions, scheduling of users in the UL and/or DL, and the like. As shown in FIG. 1C, the eNode-Bs 160a, 160b, 160c may communicate with one another over an X2 interface.

The CN 106 shown in FIG. 1C may include a mobility management entity (MME) 162, a serving gateway (SGW) 164, and a packet data network (PDN) gateway (PGW) 166. While the foregoing elements are depicted as part of the CN 106, it will be appreciated that any of these elements may be owned and/or operated by an entity other than the CN operator.

The MME 162 may be connected to each of the eNode-Bs 162a, 162b, 162c in the RAN 104 via an S1 interface and may serve as a control node. For example, the MME 162 may be responsible for authenticating users of the WTRUs 102a, 102b, 102c, bearer activation/deactivation, selecting a particular serving gateway during an initial attach of the WTRUs 102a, 102b, 102c, and the like. The MME 162 may provide a control plane function for switching between the RAN 104 and other RANs (not shown) that employ other radio technologies, such as GSM and/or WCDMA.

The SGW 164 may be connected to each of the eNode Bs 160a, 160b, 160c in the RAN 104 via the S1 interface. The SGW 164 may generally route and forward user data packets to/from the WTRUs 102a, 102b, 102c. The SGW 164 may perform other functions, such as anchoring user planes during inter-eNode B handovers, triggering paging when DL data is available for the WTRUs 102a, 102b, 102c, managing and storing contexts of the WTRUs 102a, 102b, 102c, and the like.

The SGW 164 may be connected to the PGW 166, which may provide the WTRUs 102a, 102b, 102c with access to packet-switched networks, such as the Internet 110, to facilitate communications between the WTRUs 102a, 102b, 102c and IP-enabled devices.

The CN 106 may facilitate communications with other networks. For example, the CN 106 may provide the WTRUs 102a, 102b, 102c with access to circuit-switched networks, such as the PSTN 108, to facilitate communications between the WTRUs 102a, 102b, 102c and traditional land-line communications devices. For example, the CN 106 may include, or may communicate with, an IP gateway (e.g., an IP multimedia subsystem (IMS) server) that serves as an interface between the CN 106 and the PSTN 108. In addition, the CN 106 may provide the WTRUs 102a, 102b, 102c with access to the other networks 112, which may include other wired and/or wireless networks that are owned and/or operated by other service providers.

Although the WTRU is described in FIGS. 1A-1D as a wireless terminal, it is contemplated that in certain representative embodiments that such a terminal may use (e.g., temporarily or permanently) wired communication interfaces with the communication network.

In representative embodiments, the other network 112 may be a WLAN.

A WLAN in Infrastructure Basic Service Set (BSS) mode may have an Access Point (AP) for the BSS and one or more stations (STAs) associated with the AP. The AP may have access or an interface to a Distribution System (DS) or another type of wired/wireless network that carries traffic in to and/or out of the BSS. Traffic to STAs that originates from outside the BSS may arrive through the AP and may be delivered to the STAs. Traffic originating from STAs to destinations outside the BSS may be sent to the AP to be delivered to respective destinations. Traffic between STAs within the BSS may be sent through the AP, for example, where the source STA may send traffic to the AP and the AP may deliver the traffic to the destination STA. The traffic between STAs within a BSS may be considered and/or referred to as peer-to-peer traffic. The peer-to-peer traffic may be sent between (e.g., directly between) the source and destination STAs with a direct link setup (DLS). In certain representative embodiments, the DLS may use an 802.11e DLS or an 802.11z tunneled DLS (TDLS). A WLAN using an Independent BSS (IBSS) mode may not have an AP, and the STAs (e.g., all of the STAs) within or using the IBSS may communicate directly with each other. The IBSS mode of communication may sometimes be referred to herein as an "ad-hoc" mode of communication.

When using the 802.11ac infrastructure mode of operation or a similar mode of operations, the AP may transmit a beacon on a fixed channel, such as a primary channel. The primary channel may be a fixed width (e.g., 20 MHz wide bandwidth) or a dynamically set width. The primary channel may be the operating channel of the BSS and may be used by the STAs to establish a connection with the AP. In certain representative embodiments, Carrier Sense Multiple Access with Collision Avoidance (CSMA/CA) may be implemented, for example in 802.11 systems. For CSMA/CA, the STAs (e.g., every STA), including the AP, may sense the primary channel. If the primary channel is sensed/detected and/or determined to be busy by a particular STA, the particular STA may back off. One STA (e.g., only one station) may transmit at any given time in a given BSS.

High Throughput (HT) STAs may use a 40 MHz wide channel for communication, for example, via a combination of the primary 20 MHz channel with an adjacent or nonadjacent 20 MHz channel to form a 40 MHz wide channel.

Very High Throughput (VHT) STAs may support 20 MHz, 40 MHz, 80 MHz, and/or 160 MHz wide channels. The 40 MHz, and/or 80 MHz, channels may be formed by combining contiguous 20 MHz channels. A 160 MHz channel may be formed by combining 8 contiguous 20 MHz channels, or by combining two non-contiguous 80 MHz channels, which may be referred to as an 80+80 configuration. For the 80+80 configuration, the data, after channel encoding, may be passed through a segment parser that may divide the data into two streams. Inverse Fast Fourier Transform (IFFT) processing, and time domain processing, may be done on each stream separately. The streams may be mapped on to the two 80 MHz channels, and the data may be transmitted by a transmitting STA. At the receiver of the receiving STA, the above described operation for the 80+80 configuration may be reversed, and the combined data may be sent to the Medium Access Control (MAC).

Sub 1 GHz modes of operation are supported by 802.11af and 802.11ah. The channel operating bandwidths, and carriers, are reduced in 802.11af and 802.11ah relative to those used in 802.11n, and 802.11ac. 802.11af supports 5 MHz, 10 MHz, and 20 MHz bandwidths in the TV White Space (TVWS) spectrum, and 802.11ah supports 1 MHz, 2 MHz, 4 MHz, 8 MHz, and 16 MHz bandwidths using non-TVWS spectrum. According to a representative embodiment, 802.11ah may support Meter Type Control/Machine-Type Communications (MTC), such as MTC devices in a macro coverage area. MTC devices may have certain capabilities, for example, limited capabilities including support for (e.g., only support for) certain and/or limited bandwidths. The MTC devices may include a battery with a battery life above a threshold (e.g., to maintain a very long battery life).

WLAN systems, which may support multiple channels, and channel bandwidths, such as 802.11n, 802.11ac, 802.11af, and 802.11ah, include a channel which may be designated as the primary channel. The primary channel may have a bandwidth equal to the largest common operating bandwidth supported by all STAs in the BSS. The bandwidth of the primary channel may be set and/or limited by a STA, from among all STAs in operating in a BSS, which supports the smallest bandwidth operating mode. In the example of 802.11ah, the primary channel may be 1 MHz wide for STAs (e.g., MTC type devices) that support (e.g., only support) a 1 MHz mode, even if the AP, and other STAs in the BSS support 2 MHz, 4 MHz, 8 MHz, 16 MHz, and/or other channel bandwidth operating modes. Carrier sensing and/or Network Allocation Vector (NAV) settings may depend on the status of the primary channel. If the primary channel is busy, for example, due to a STA (which supports only a 1 MHz operating mode) transmitting to the AP, all available frequency bands may be considered busy even though a majority of the available frequency bands remains idle.

In the United States, the available frequency bands, which may be used by 802.11ah, are from 902 MHz to 928 MHz. In Korea, the available frequency bands are from 917.5 MHz to 923.5 MHz. In Japan, the available frequency bands are from 916.5 MHz to 927.5 MHz. The total bandwidth available for 802.11ah is 6 MHz to 26 MHz depending on the country code.

Figure 1D:
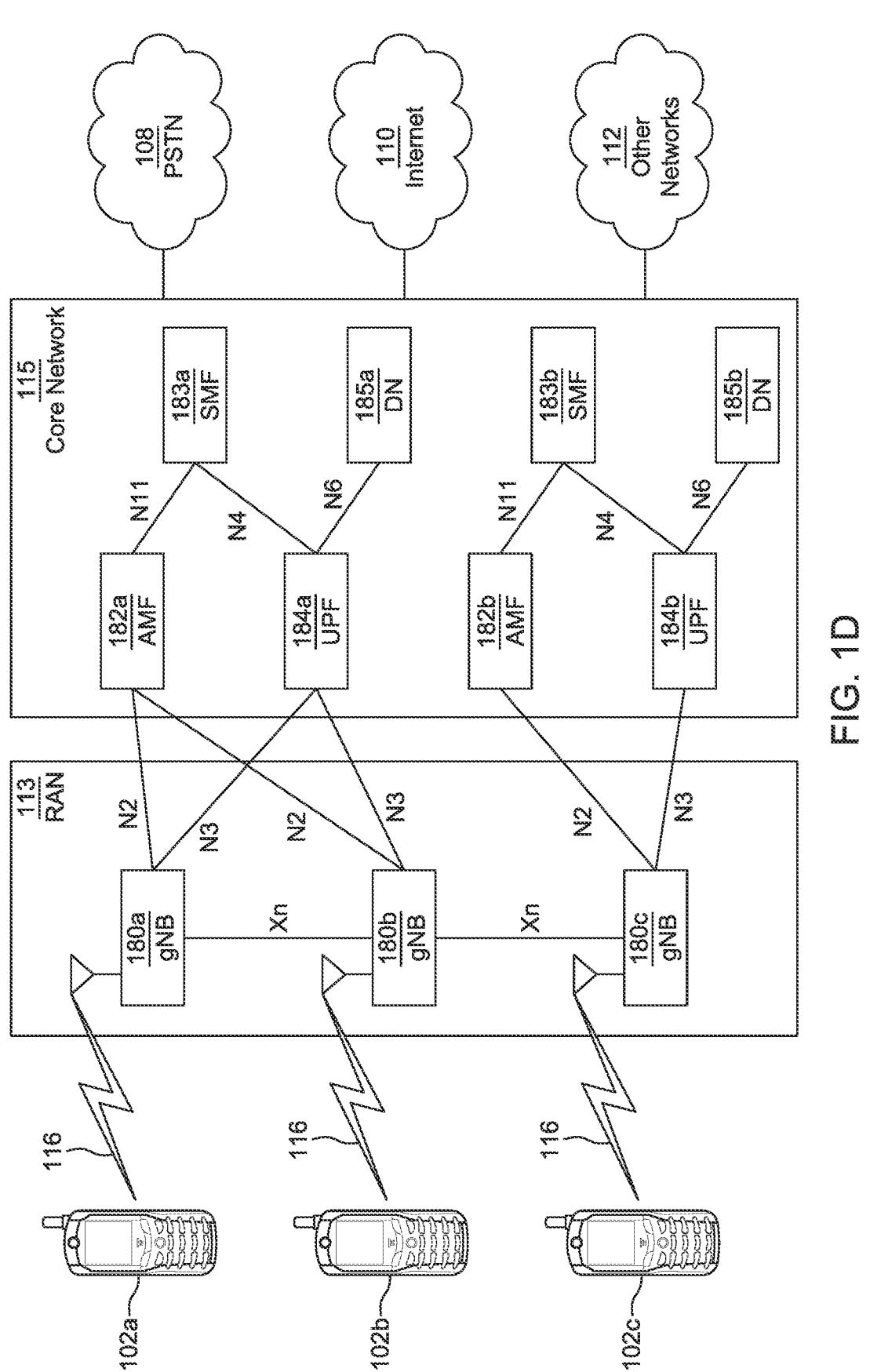
FIG. 1D is a system diagram illustrating a further example RAN and a further example CN that may be used within the communications system illustrated in FIG. 1A according to an embodiment.

FIG. 1D is a system diagram illustrating the RAN 104 and the CN 106 according to an embodiment. As noted above, the RAN 104 may employ an NR radio technology to communicate with the WTRUs 102a, 102b, 102c over the air interface 116. The RAN 104 may also be in communication with the CN 106.

The RAN 104 may include gNBs 180a, 180b, 180c, though it will be appreciated that the RAN 104 may include any number of gNBs while remaining consistent with an embodiment. The gNBs 180a, 180b, 180c may each include one or more transceivers for communicating with the WTRUs 102a, 102b, 102c over the air interface 116. In one embodiment, the gNBs 180a, 180b, 180c may implement MIMO technology. For example, gNBs 180a, 108b may utilize beamforming to transmit signals to and/or receive signals from the gNBs 180a, 180b, 180c. Thus, the gNB 180a, for example, may use multiple antennas to transmit wireless signals to, and/or receive wireless signals from, the WTRU 102a. In an embodiment, the gNBs 180a, 180b, 180c may implement carrier aggregation technology. For example, the gNB 180a may transmit multiple component carriers to the WTRU 102a (not shown). A subset of these component carriers may be on unlicensed spectrum while the remaining component carriers may be on licensed spectrum. In an embodiment, the gNBs 180a, 180b, 180c may implement Coordinated Multi-Point (CoMP) technology. For example, WTRU 102a may receive coordinated transmissions from gNB 180a and gNB 180b (and/or gNB 180c).

The WTRUs 102a, 102b, 102c may communicate with gNBs 180a, 180b, 180c using transmissions associated with a scalable numerology. For example, the OFDM symbol spacing and/or OFDM subcarrier spacing may vary for different transmissions, different cells, and/or different portions of the wireless transmission spectrum. The WTRUs 102a, 102b, 102c may communicate with gNBs 180a, 180b, 180c using subframe or transmission time intervals (TTIs) of various or scalable lengths (e.g., containing a varying number of OFDM symbols and/or lasting varying lengths of absolute time).

The gNBs 180a, 180b, 180c may be configured to communicate with the WTRUs 102a, 102b, 102c in a standalone configuration and/or a non-standalone configuration. In the standalone configuration, WTRUs 102a, 102b, 102c may communicate with gNBs 180a, 180b, 180c without also accessing other RANs (e.g., such as eNode-Bs 160a, 160b, 160c). In the standalone configuration, WTRUs 102a, 102b, 102c may utilize one or more of gNBs 180a, 180b, 180c as a mobility anchor point. In the standalone configuration, WTRUs 102a, 102b, 102c may communicate with gNBs 180a, 180b, 180c using signals in an unlicensed band. In a non-standalone configuration WTRUs 102a, 102b, 102c may communicate with/connect to gNBs 180a, 180b, 180c while also communicating with/connecting to another RAN such as eNode-Bs 160a, 160b, 160c. For example, WTRUs 102a, 102b, 102c may implement DC principles to communicate with one or more gNBs 180a, 180b, 180c and one or more eNode-Bs 160a, 160b, 160c substantially simultaneously. In the non-standalone configuration, eNode-Bs 160a, 160b, 160c may serve as a mobility anchor for WTRUs 102a, 102b, 102c and gNBs 180a, 180b, 180c may provide additional coverage and/or throughput for servicing WTRUs 102a, 102b, 102c.

Each of the gNBs 180a, 180b, 180c may be associated with a particular cell (not shown) and may be configured to handle radio resource management decisions, handover decisions, scheduling of users in the UL and/or DL, support of network slicing, DC, interworking between NR and E-UTRA, routing of user plane data towards User Plane Function (UPF) 184a, 184b, routing of control plane information towards Access and Mobility Management Function (AMF) 182a, 182b and the like. As shown in FIG. 1D, the gNBs 180a, 180b, 180c may communicate with one another over an Xn interface.

The CN 106 shown in FIG. 1D may include at least one AMF 182a, 182b, at least one UPF 184a,184b, at least one Session Management Function (SMF) 183a, 183b, and possibly a Data Network (DN) 185a, 185b. While the foregoing elements are depicted as part of the CN 106, it will be appreciated that any of these elements may be owned and/or operated by an entity other than the CN operator.

The AMF 182a, 182b may be connected to one or more of the gNBs 180a, 180b, 180c in the RAN 104 via an N2 interface and may serve as a control node. For example, the AMF 182a, 182b may be responsible for authenticating users of the WTRUs 102a, 102b, 102c, support for network slicing (e.g., handling of different protocol data unit (PDU) sessions with different requirements), selecting a particular SMF 183a, 183b, management of the registration area, termination of non-access stratum (NAS) signaling, mobility management, and the like. Network slicing may be used by the AMF 182a, 182b in order to customize CN support for WTRUs 102a, 102b, 102c based on the types of services being utilized WTRUs 102a, 102b, 102c. For example, different network slices may be established for different use cases such as services relying on ultra-reliable low latency (URLLC) access, services relying on enhanced massive mobile broadband (eMBB) access, services for MTC access, and the like. The AMF 182a, 182b may provide a control plane function for switching between the RAN 104 and other RANs (not shown) that employ other radio technologies, such as LTE, LTE-A, LTE-A Pro, and/or non-3GPP access technologies such as WiFi.

The SMF 183a, 183b may be connected to an AMF 182a, 182b in the CN 106 via an N11 interface. The SMF 183a, 183b may also be connected to a UPF 184a, 184b in the CN 106 via an N4 interface. The SMF 183a, 183b may select and control the UPF 184a, 184b and configure the routing of traffic through the UPF 184a, 184b. The SMF 183a, 183b may perform other functions, such as managing and allocating UE IP address, managing PDU sessions, controlling policy enforcement and QoS, providing DL data notifications, and the like. A PDU session type may be IP-based, non-IP based, Ethernet-based, and the like.

The UPF 184a, 184b may be connected to one or more of the gNBs 180a, 180b, 180c in the RAN 104 via an N3 interface, which may provide the WTRUs 102a, 102b, 102c with access to packet-switched networks, such as the Internet 110, to facilitate communications between the WTRUs 102a, 102b, 102c and IP-enabled devices. The UPF 184, 184b may perform other functions, such as routing and forwarding packets, enforcing user plane policies, supporting multi-homed PDU sessions, handling user plane QoS, buffering DL packets, providing mobility anchoring, and the like.

The CN 106 may facilitate communications with other networks. For example, the CN 106 may include, or may communicate with, an IP gateway (e.g., an IP multimedia subsystem (IMS) server) that serves as an interface between the CN 106 and the PSTN 108. In addition, the CN 106 may provide the WTRUs 102a, 102b, 102c with access to the other networks 112, which may include other wired and/or wireless networks that are owned and/or operated by other service providers. In one embodiment, the WTRUs 102a, 102b, 102c may be connected to a local DN 185a, 185b through the UPF 184a, 184b via the N3 interface to the UPF 184a, 184b and an N6 interface between the UPF 184a, 184b and the DN 185a, 185b.

In view of FIGS. 1A-1D, and the corresponding description of FIGS. 1A-1D, one or more, or all, of the functions described herein with regard to one or more of: WTRU 102a-d, Base Station 114a-b, eNode-B 160a-c, MME 162, SGW 164, PGW 166, gNB 180a-c, AMF 182a-b, UPF 184a-b, SMF 183a-b, DN 185a-b, and/or any other device (s) described herein, may be performed by one or more emulation devices (not shown). The emulation devices may be one or more devices configured to emulate one or more, or all, of the functions described herein. For example, the emulation devices may be used to test other devices and/or to simulate network and/or WTRU functions.

The emulation devices may be designed to implement one or more tests of other devices in a lab environment and/or in an operator network environment. For example, the one or more emulation devices may perform the one or more, or all, functions while being fully or partially implemented and/or deployed as part of a wired and/or wireless communication network in order to test other devices within the communication network. The one or more emulation devices may perform the one or more, or all, functions while being temporarily implemented/deployed as part of a wired and/or wireless communication network. The emulation device may be directly coupled to another device for purposes of testing and/or performing testing using over-the-air wireless communications.

The one or more emulation devices may perform the one or more, including all, functions while not being implemented/deployed as part of a wired and/or wireless communication network. For example, the emulation devices may be utilized in a testing scenario in a testing laboratory and/or a non-deployed (e.g., testing) wired and/or wireless communication network in order to implement testing of one or more components. The one or more emulation devices may be test equipment. Direct RF coupling and/or wireless communications via RF circuitry (e.g., which may include one or more antennas) may be used by the emulation devices to transmit and/or receive data.

For a given wireless communication system, such as those described and related to FIGS. 1A, 1B, 1C, and 1D, there may be low latency applications of wireless communication, such as Ultra-reliable and low latency communication (URLLC) that requires very low latency in the decoding process. Polar codes may provide some of the best error-correction performances along with superior energy efficiency (e.g., energy/bit) for a different range of code blocks. However, the conventional decoding algorithms used in Polar codes, such as successive-cancellation (SC), and successive-cancellation-list (SCL) may suffer from large decoding latency due to the sequential characteristic of these decoding procedures. The inherent latency in these approaches may result in additional end-to-end link-level latency, which may also translate into reduced throughput. It follows then that the applicability of Polar codes with SC based decoding algorithms for error-correction in URLLC as well as high-throughput communications (e.g., data communications, such as eMBB) may be relatively limited. However, BP (belief propagation) based decoding is an inherently parallel procedure that has significantly lower decoding latency and higher throughput potential compared with the sequential decoding candidates. In one or more embodiments discussed herein, there are approaches to resolve and improve upon different encoding and decoding methods that may improve the latency performance of BP based decoding by introducing procedures to enable early-start of these decoding techniques.

Due to its superior performance in small block lengths, polar codes may be used as the channel coding scheme in control channel forward error correction (FEC) operations in NR. Polar code encoding is defined as the following:

$$c_1^N = u_1^N G_N \qquad \text{Equation 1}$$

The codeword vector of polar code $$c_1^N$$

is generated by the product of the input vector $$u_1^N$$

and generator matrix $G_N$. The polar code $$c_1^N$$

and the input vector $$u_1^N$$

may be binary vectors with length $N=2^n$, where N denotes the codeword block-length. The generator matrix $G_N$ may be defined by the Kronecker power of $$F = \begin{bmatrix} 1 & 0 \\ 1 & 1 \end{bmatrix},$$

$$G_N = F^{\otimes n} \qquad \text{Equation 2}$$

where $(\ )^{\otimes n}$ stands for n-th Kronecker power of $(\ )$. The generator matrix may also be defined as $G_N = B_N F^{\otimes n}$, where $B_N$ denotes the bit reversing matrix and it changes the order of elements in $$u_1^N = [u_1, u_2, \ldots, u_N].$$

The bit reversing operation may be further described herein. Without loss of generality, $G_N = F^{\otimes n}$ may be assumed unless noted otherwise as discussed herein.

Some input bits for polar code may have a fixed value (e.g., zero) and are called "frozen bits". The input indexes for frozen bits may be represented by the set $$A^c = \{a_1^c, a_2^c, a_3^c, \ldots, a_{N-K}^c\}$$

and $$a_i^c < a_j^c \text{ if } i < j.$$

The remaining part of input bits for polar code may convey variable information bits and are called "unfrozen bits". The input indexes for unfrozen bits may be represented by the set $A=\{a_1, a_2, a_3, \ldots, a_K\}$ and $a_i < a_j$ if $i<j$. The number of information bits, or unfrozen bits, may be defined as K and the number of frozen bits may be N−K.

The code rate R of polar code may be defined as $$\frac{K}{N}.$$

The determination process of input bit indexes for frozen bits and unfrozen bits is called "code construction" for polar code.

Figure 2:
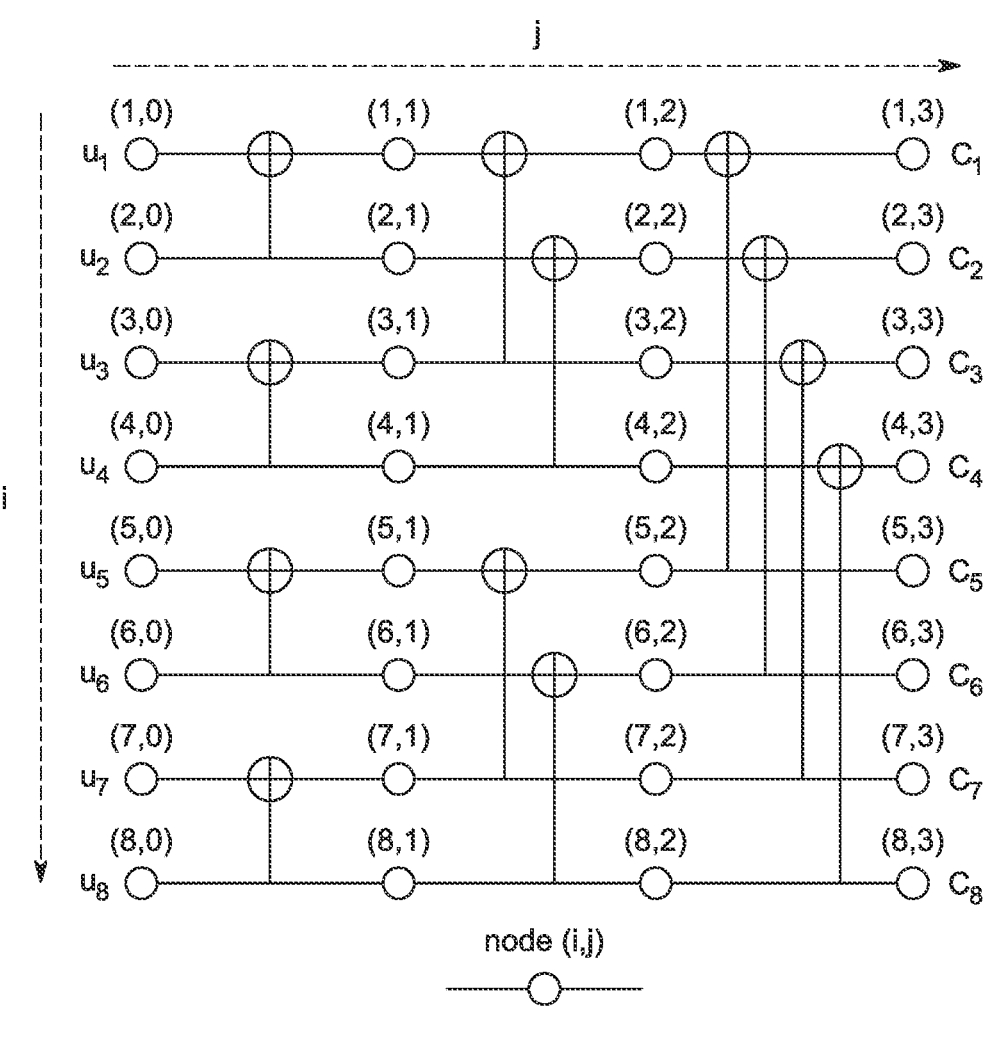
FIG. 2 is a diagram that illustrates an example polar encoder with the code word block-length N=8.

FIG. 2 is a diagram that illustrates an example polar encoder with the code word block-length N=8. As shown, the polar encoder may be represented by the nodes and the nodes are denoted by (i,j), i=1, . . . , N and j=0, . . . , n. As an example, consider the calculation of the value assigned to node (1,2) only. $u_1$ and $u_2$ are XOR'ed, which is assigned to node (1,1). $u_3$ and $u_4$ are XOR'ed, which is assigned to node (3,1). Then, the values of nodes (1,1) and (3,1) are XOR'ed, which is assigned to node (1,2). The values of the other nodes in FIG. 2 may be similarly determined.

There may be several code construction methods for polar code. In general, the methods may initially calculate the reliability of each input bit index, and then have an order of bit index reliabilities before starting the encoding operation. From the obtained reliability order, the least reliable input bits may be assigned as frozen bits and the remaining bits may be assigned as unfrozen/information bits. The proportion of frozen and unfrozen bits may be determined according to the desired code rate. With the frozen and unfrozen bit locations available, the encoding operation follows as in Eq. 1 and shown in the example of FIG. 2.

Generally, decoding algorithms for polar code may be categorized into two types: Successive Cancellation (SC) based decoding, and Belief Propagation (BP) based decoding.

SC polar decoding may be a sequential decoding method to calculate log likelihood ratio (LLR) value of input bits in a serial manner; it is based on the assumption that the previously decoded bits are correct and they are used for decoding a current bit. Successive Cancellation List (SCL) decoding adopts several lists of candidate paths to improve the performance of SC decoding, where the best list is selected according to the outcome of the LLR calculation. Cyclic redundancy check (CRC) Aided Successive Cancellation List (CA-SCL) decoding adopts the embedded CRC as a tool to select the list. By CA-SCL decoding, polar code may achieve error performance comparable or superior to conventional low-density parity-check (LDPC) code or turbo code.

In some cases polar code may be decoded by a message passing algorithm called standard Belief Propagation (BP) based decoding or LDPC-like BP decoding according to the sum product algorithm or min sum algorithm; this may be shown with a factor graph representation of polar code (e.g., FIG. 2). Message passing may be a powerful technique that may be used in various iterative based decoders, such as within LDPC decoders and neural networks.

BP based decoding (a.k.a., BP decoding) may be used in decoding of various code-classes, including LDPC codes. As described herein, BP decoding may be applied to polar codes. In an improved approach, denoted as LDPC-like decoding, BP decoding procedures may be modified based on the features utilized in LDPC codes. Specifically, in the techniques of LDPC-like decoding, the factor graph described above (e.g., FIG. 2) may be pruned for a simpler and lower complexity configuration in order to adopt the LDPC decoding characteristics. Factor graph is a bipartite graph and used in various iterative decoding methods, such as BP decoding, although it should be noted that factor graph may also be used for encoding. The factor graph may comprise of two types of nodes denoted as variable nodes and check nodes, respectively.

Figure 3:
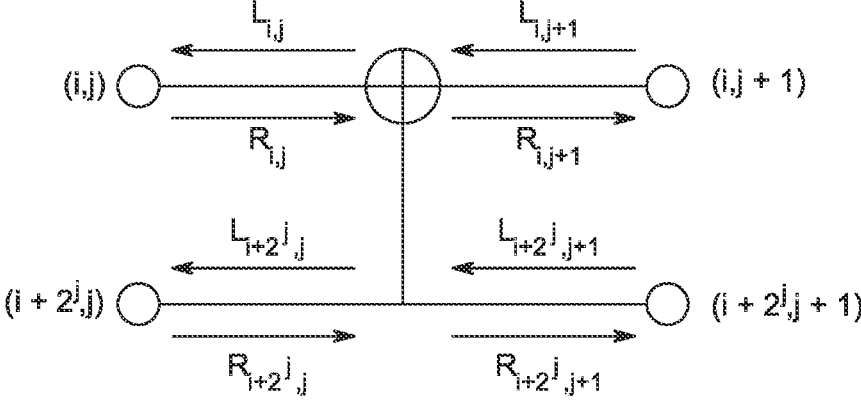
FIG. 3 is a diagram that illustrates an example of LLR message passing for BP decoding.

FIG. 3 is a diagram that illustrates an example of LLR message passing for BP decoding. The metric (e.g., LLR values) calculations and their relationships between the nodes may be observed in FIG. 3. In FIG. 3, L stands for left, and R stands for right, and i and j reference the diagram of FIG. 2. The equations of FIG. 3 are explained as follows:

$$L_{i,j} = G(L_{i,j+1}, L_{i',j+1} + R_{i',j}) \qquad \text{Equation 3}$$

$$L_{i',j} = G(R_{i,j}, L_{i,j+1}) + L_{i',j+1} \qquad \text{Equation 4}$$

$$R_{i,j+1} = G(R_{i,j}, L_{i',j+1} + R_{i',j}) \qquad \text{Equation 5}$$

$$R_{i',j+1} = G(R_{i,j}, L_{i,j+1}) + R_{i'j} \qquad \text{Equation 6}$$

Here, $G(x,y) = sgn(x)sgn(y)min(|x|, |y|)$, and $sgn(x)$ is a sign value of x. When $x \geq 0$, $sgn(x) = 1$ and when $x < 0$, $sgn(x) = -1$. $|x|$ is the absolute value of x. The standard BP decoding algorithm by message passing shown may be performed in an iterative manner. One iteration step may be divided into two half iteration steps. When round robin scheduling is assumed, the first half iteration may initially calculate metrics (e.g., LLR values) based on Eqs. 3 and 4, and starts from the rightmost nodes (codeword variable nodes) and continues with the same metric calculations (Eqs. 3 and 4), until it reaches the leftmost nodes (input bit nodes). The second half iteration may perform metric (e.g., LLR values) calculations based on Eqs. 5 and 6 starting from the leftmost nodes until reaching the rightmost nodes.

Figure 4:
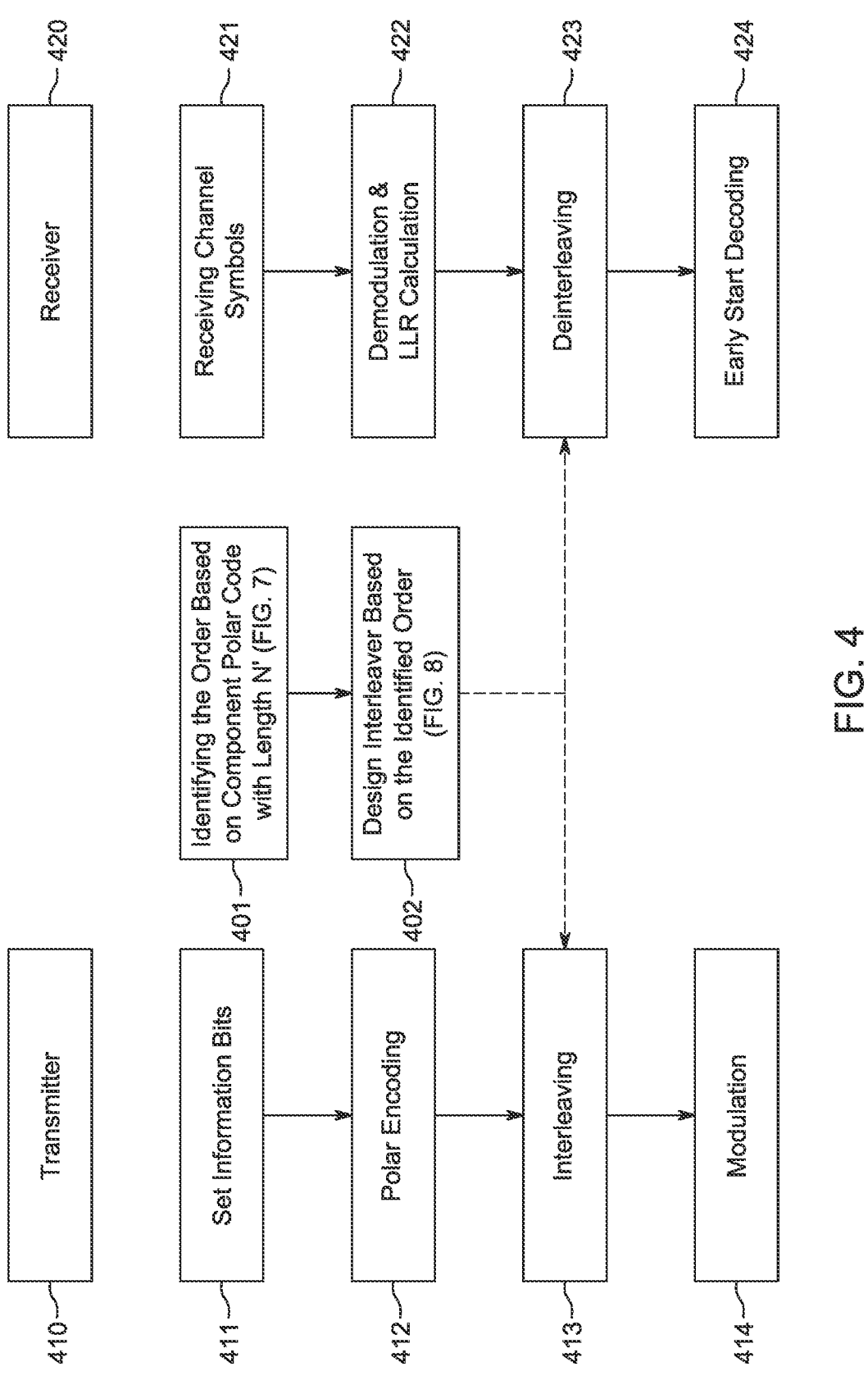
FIG. 4 is a diagram that illustrates an example method for ordered transmission of polar code.

FIG. 4 is a diagram that illustrates an example method for ordered transmission of polar code. Generally, a transmission procedure has a transmitter 410 start with a set of information bits provided by a higher layer at 411. At 412, the set of information bits are polar encoded. At 413 the polar encoded bits are interleaved according to techniques further described herein. At 414 the interleaved bits are then modulated (e.g., QPSK), at which point the resulting modulated bits are ready for transmission. A reciprocal process for decoding may occur at the receiver 420 side. Initially, at 421 channel symbols are received. At 422, the symbols are then demodulated and an LLR calculation is performed. At 423 deinterleaving is performed, the techniques of which are further described herein. At 424, early start decoding is performed.

Figure 7:
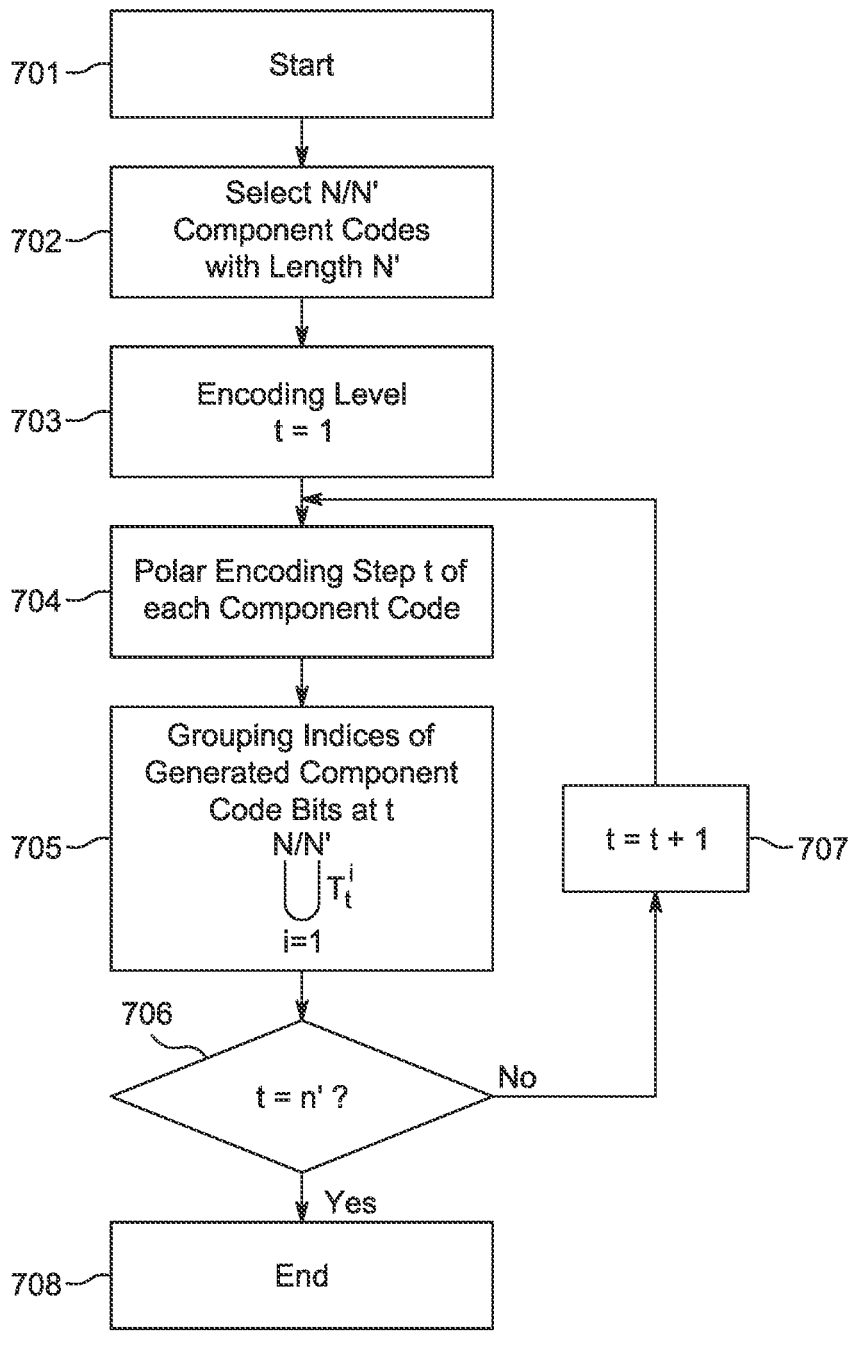
FIG. 7 is a flow chart that illustrates an example method of identifying a code bit order based on component polar codes with length $N'=2'''$.

At the encoder side (e.g., transmitter), initially the order of code bit generation may be identified based on a detailed component polar code selection procedure 401, which is further explained in the example of FIG. 7. The identified order of code bits may be used to create groups of code bit indices, which provides interleaving parameters for grouped interleaving operation at 402, which is further explained in the example of FIG. 8. At the decoder side (e.g., receiver), deinterleaving procedures based on the designed interleaver parameters at the encoder facilitate an early start of decoding of the received symbols. These procedures may enable the receiver 420 to start its decoding based on part of deinterleaved LLR values only, such as before the reception of all symbols, which may result in a faster overall decoding operation.

Figure 5:
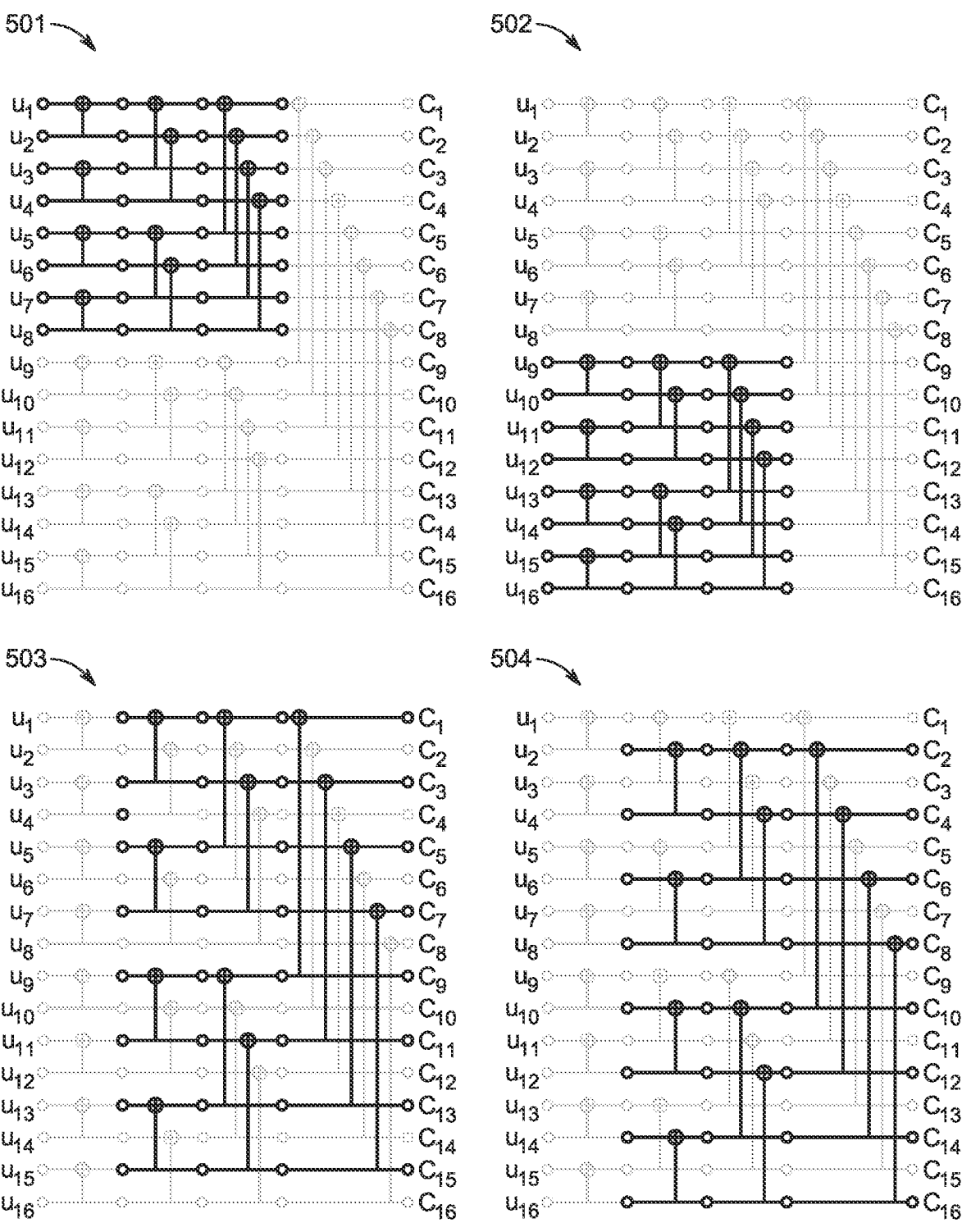
FIG. 5 is four diagrams that illustrate an example of polar code decomposition into four possible component polar codes.

FIG. 5 is four diagrams that illustrate an example of polar code decomposition into four possible component polar codes. Encoding operations on ordered code bits, such as at 412, may first involve decomposition of polar code into multiple component codes. A component polar code may have the same polar code structure as in the original polar code, however with reduced block length. As shown in the example of FIG. 5, there is polar code decomposition into component polar codes in case of N=16 and N'=8, where N' denotes the length of component polar code.

Polar code diagrams 501 and 502 show component polar codes that contain input bits (e.g., input nodes) within their structure. Polar code diagrams 503 and 504 show component polar codes that contain the output coded bits (e.g., output nodes). Note, when N=N', the component polar code may be the overall polar code itself. Also, for N=N'·N" (with N' and N" having integer values), the overall polar code may be decomposed into N/N' component polar codes each with code length of N' together with N/N" component polar codes each with code length of N".

As described herein, the component codes may be selected within the family of 501 and 502 as a main example, such that the component codes contain the input bits/input nodes in their structures and operations and any other configuration of component polar code with equal length may be assumed without loss of generality.

In some cases, the order of code bit generation in component polar code may be sequential. In such cases, n timing steps are required for encoding a code block with length $N=2^n$; at each timing step, a specific part of coded bits may be generated.

Figure 6:
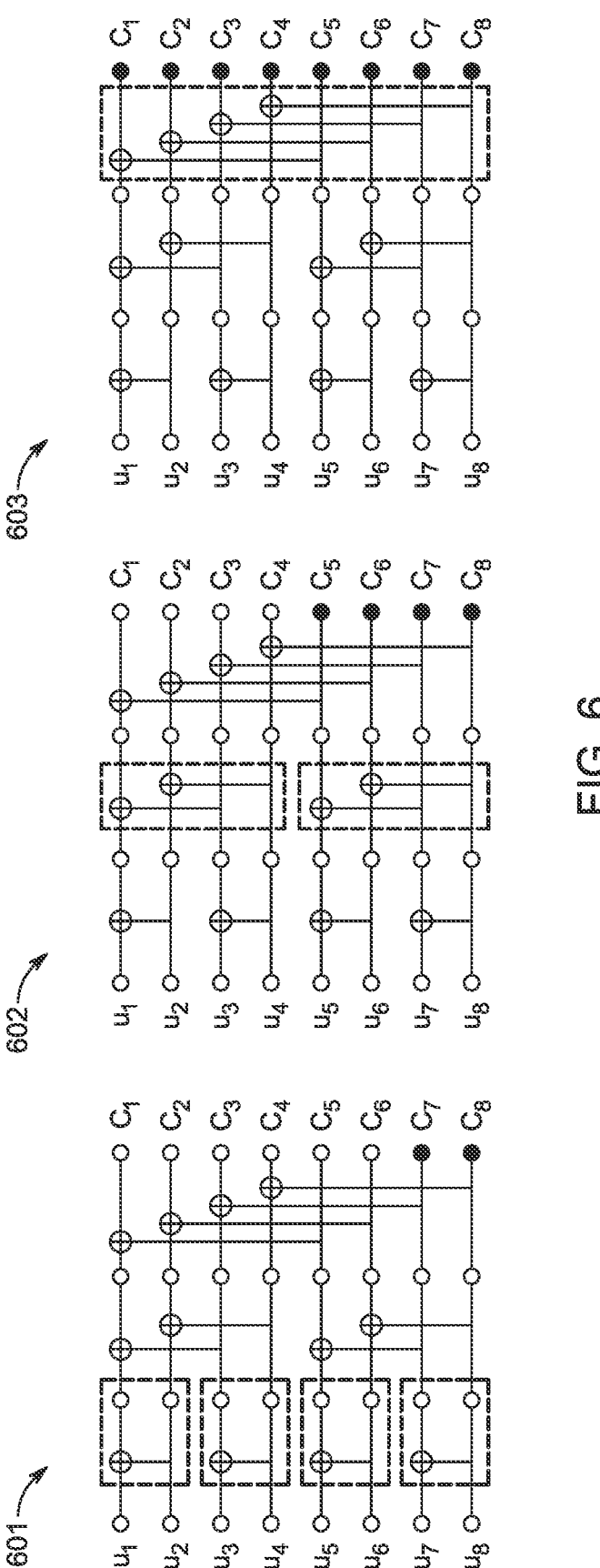
FIG. 6 are three diagrams that illustrate sequential encoding steps and coded bit generations at each timing step for a given component polar code of length N'=8.

FIG. 6 shows three diagrams that illustrate sequential encoding steps and coded bit generation at each timing step for a given component polar code of length N'=8. As shown, the solid black (i.e., filled in circles) nodes may indicate the generation of code bits at each timing stage (e.g., 601, 602, and 603), and the dashed lines indicate XOR operations corresponding to each step; in this example there are three steps or stages. The code bits $c_7$, $c_8$ are generated at timing step 601; the code bits $c_5$, $c_6$ are generated at timing step 602; and the coded bits $c_1$, $c_2$, $c_3$, $c_4$ are generated at timing step 603. Once a code bit is generated at a given encoding step, its value remains unchanged in the upcoming encoding steps. Following this example, the code bit generation steps may be expressed as follows: $c_{N+1-2^t}$ to $c_N$ bits are generated until timing step t=1, . . . , n, and $c_{N+1-2^t}$ to $c_{N-2^{t-1}}$ bits are generated at timing step t=2, . . . , n.

FIG. 7 is a flow chart that illustrates an example method of identifying a code bit order based on component polar codes with length $N'=2^{m'}$. At 701 the process starts as part of an overall transmission process. At 702, N/N' component codes with length N' are selected. At 703, the encoding level is established, for example, starting with t=1. At 704, there may be polar encoding step t of each component code.

At 705, if the set of code bit indices generated at timing step t is defined as $T_t$, then the corresponding code bits may be grouped under this set $T_t$. Then, the grouped bits (e.g., sets) may be ordered in accordance with their order of generation, which may be denoted as $T_1$, $T_2$, . . . , $T_{n'}$, ($N'=2^{m'}$).

At 706, if t=n' then the order determination process is over, and the transmission process (e.g., see example FIG. 4) may continue. If no, then t is incremented at 707, and the process repeats at 704.

At the end of the process 708, the transmission may be performed based on this grouping order such that the code bits are transmitted following the sequence of $T_1$, $T_2$, . . . , $T_{n'}$, ($N'=2^{m'}$). In an example, using the notation in FIG. 2 (e.g., $c_m$ is represented by index m), $T_1=\{7,8\}$, $T_2=\{5,6\}$, and $T_3=\{1,2,3,4\}$. Hence, the order of transmission may follow the sequence $T_1$, $T_2$, $T_3$. Specifically, in this example, the code bit sequence 7,8,5,6,1,2,3,4 (e.g., $c_7$, $c_8$, $c_5$, $c_6$, $c_1$, $c_2$, $c_3$, $c_4$) may represent an order of transmission. Further, within the set $T_t$ the corresponding code bits may be generated during the same timing step, and the order of transmission within this set may be arbitrary, such as $T_3=\{1,2,3,4\}\rightarrow1,2,3,4\rightarrow4,3,2,1\rightarrow2,1,4,3$, etc. Hence, the overall transmit bit code sequence may be altered accordingly.

Moreover, the order of transmission may be reversed, bit reversed, or bit reversed of reversed (e.g., reverse a sequence (01,10,11) as (11,10,01), and then apply bit reversal to this reversed sequence which would be (00,01,10)). For example, by reversing, i→N'+1−i: $T_1=\{2,1\}$; $T_2=\{4,3\}$; $T_3=\{8,7,6,5\}$.

By bit reversing, i=0xpqr . . . s+1, a bit reversing of i may be equal to 0xs . . . rqp+1 (where 0xpqr . . . s is the binary expression of i−1). For example, the bit reversing of i is 0x011+1=0x100=4 when i=7=0x111=0x110+1. By applying this reversing operation, the following orders may be obtained: $T_1=\{4,8\}$; $T_2=\{2,6\}$; $T_3=\{1,5,3,7\}$.

By applying another reversing operation on the bit reversing, the following orders may be obtained: $T_1=\{5,1\}$; $T_2=\{7,3\}$, $T_3=\{8,4,6,2\}$.

In a polar code that is composed of N/N' component polar codes with length N', the order of transmission may similarly follow the order of code bit generation in each component polar code. That is, when $$T_t^i$$

stands for the set of code bit indices generated at timing step t for the i-th component code, the transmission order may be given by:

$$U_{i=1}^{N/N'} T_1^i, \ U_{i=1}^{N/N'} T_2^i, \ \dots, \ U_{i=1}^{N/N'} T_{N'}^i \qquad \text{Equation 7}$$

Note that at 705, $$U_{i=1}^{N/N'} T_t^i$$

denotes the union of set $$T_t^i$$

and the set contains indices of all elements of code bits generated at timing step t for all N/N' polar component codes with length N'. For example, when N=16 and N'=8 and the component code type corresponding to 501 and 502 is adopted, then $$U_{i=1}^{2} T_1^i = \{7, 8, 15, 16\}; \ U_{i=1}^{2} T_2^i = \{5, 6, 13, 14\};$$

$$\bigcup_{i=1}^{2} T_3^i = \{1, 2, 3, 4, 9, 10, 11, 12\}.$$

As shown in the example, the transmit code bit order may be identified based on component polar code.

Generally, there may be modifications to polar codes that result in similar error performance and code construction procedures. For example, some modifications may include the removal of the bit reversing interleaver, or reversing the order of the encoding stages (e.g., corresponding to the vertical index j in FIG. 2). The ordered transmission schemes discussed herein may be applied to these modified polar code candidates in a straightforward manner.

Figure 8:
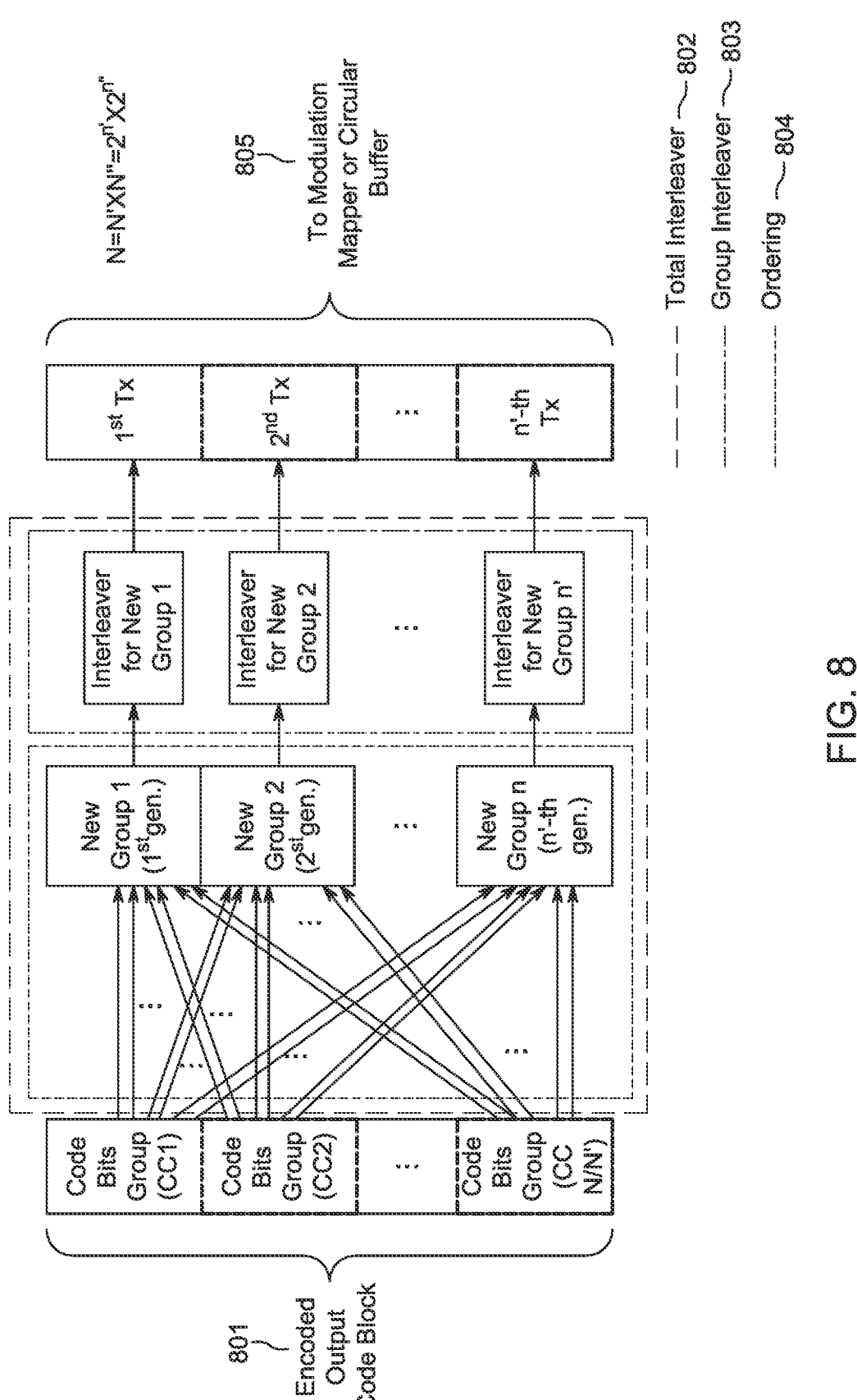
FIG. 8 is a diagram that illustrates an example of ordered grouping and group interleaving.

FIG. 8 is a diagram that illustrates an example of ordered grouping and group interleaving. Following encoding, interleaving may be performed based on the identified code bit order. The procedures disclosed herein (e.g., FIG. 7) may be considered a grouping of polar code bits according to an identified code bit generation order, where this order is determined based on the code bit generation in component polar codes. The polar code bits may be grouped based on the index of output nodes, in accordance with the selected component polar codes which are used to determine the code bit order. See for example the encoded output code block 801 from code bit group 1 to code bit group N/N' in FIG. 8. That is, the grouping of polar code bits corresponds to dividing the total code bit block of a standard order (e.g., $c_1$, $c_2$, . . . , $c_{16}$ in FIG. 5) into small code bits blocks each with length N'. In this case, each code bit group (code bit block) corresponds to each component code of type 501 and 502 in FIG. 5.

From the code bits generated in the above paragraph, the ones that correspond to the same encoding and code bit generation timing steps may be selected and gathered in a new group, such as ordering at 804. The "new group" corresponds to $$U_{i=1}^{N/N'} T_t^i.$$

For example, the first "new group" contains the code bits that have the same vertical, or row, index with the nodes generated at the first timing step of the component polar codes $$\left(U_{i=1}^{N/N'}\, T_1^i\right)$$

and the last "new group" is gathered code bits that have the same vertical, or row, index with the nodes generated at the last timing step of the component polar codes $$\left(U_{i=1}^{N/N'}\, T_{n''}^i\right).$$

To improve error performance in the burst error channel (e.g., fading channel), an interleaving operation may be necessary. For each ordered group, the code bits within the group may be interleaved by the group interleaver at 803. The group interleaver 803 may be a pseudo-random interleaver or block interleaver.

Figures 9, 10:
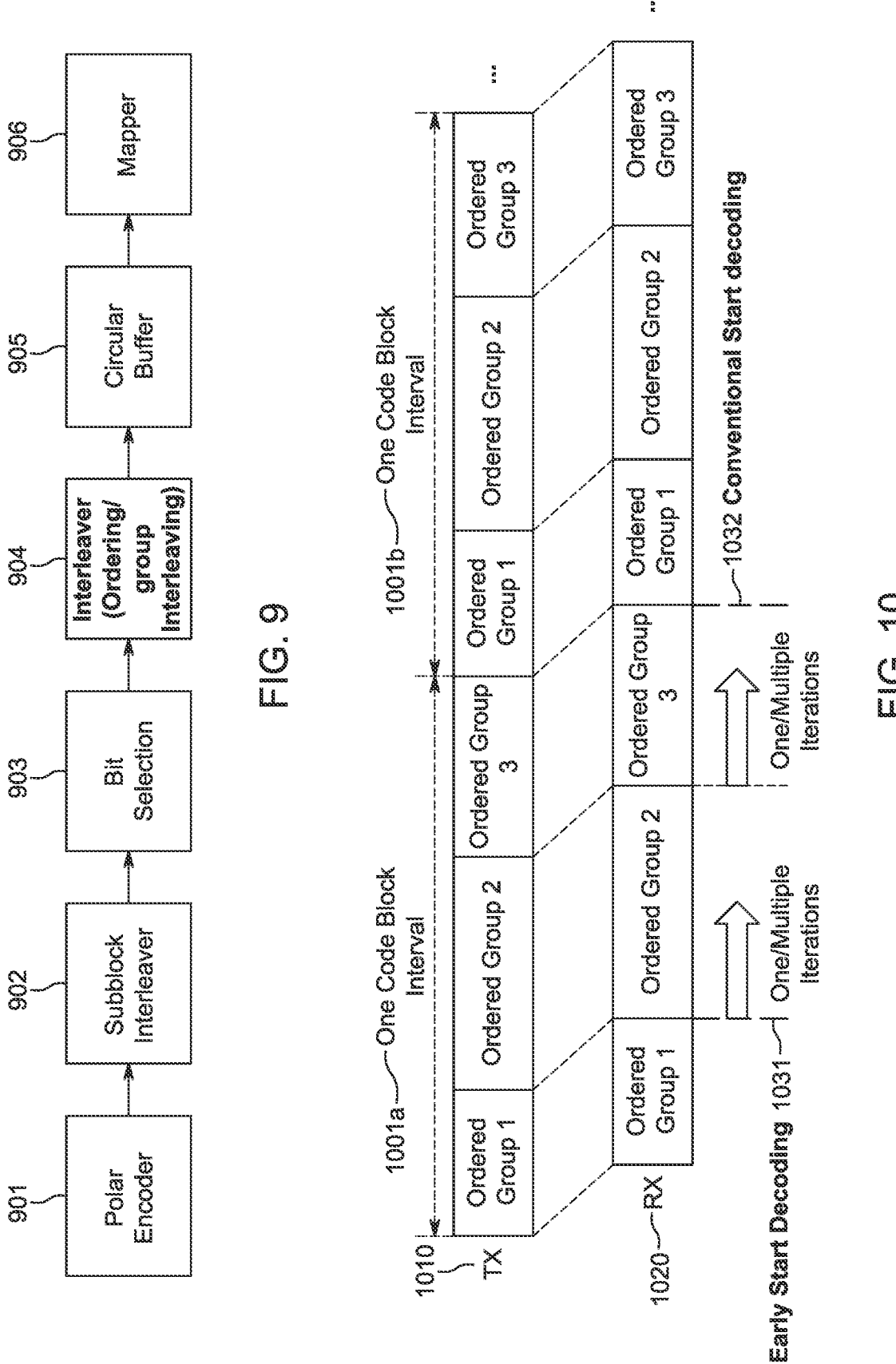
FIG. 9 is a flow chart that illustrates an example of a NR multiplexing chain modified with an interleaving step 904 inserted.
FIG. 10 is a diagram that illustrates an example of timing relation in early start decoding.

The combination of ordering of the code bits, placing them under the groups according to this ordering 804, and interleaving of the code bit groups 803 as a whole may be considered interleaving over the total code bits 802. The interleaver processes, including ordering, creation of code bit groups, and group interleaving may be inserted in a NR multiplexing chain as shown in FIG. 9, where the next step would be to a modulation mapper and/or a circular buffer (e.g., 805). N' may be equal to the length of subblock used for subblock interleaver, which may be N'=32 in NR implementations.

As noted above, FIG. 9 is a flow chart that illustrates an example of a NR multiplexing chain modified with an interleaving stage 904 inserted. The process would otherwise include one or more of the following elements/stages: polar encoding 901, subblock interleaver 902, bit selection 903, circular buffer 905, and modulation mapper 906.

Generally, a decoding operation may be performed with ordered code bits just as they were generated in an encoding operation as discussed herein. Belief propagation (BP) based decoding operations performed on ordered code bits may enable an early start to the decoding process. BP based decoding may be mostly performed in an iterative manner with multiple iterations to complete the overall decoding operation. In conventional polar decoding, the decoding may start when the LLR values corresponding to all code bits are prepared after reception of all channel symbols. In comparison, for BP based decoding the decoder may begin the decoding operation before receiving all channel symbols, which may allow for a faster response time.

FIG. 10 is a diagram that illustrates an example of timing relation in early start decoding. In one code block interval, such as 1001a, for the TX there may be several ordered groups (e.g., ordered group 1, ordered group 2, and ordered group 3). Similarly, the RX 1020 may receive the same as what was transmitted from the TX 1010.

Based on the transmission procedures disclosed herein, the RX 1020 may receive the channel symbols according to the selected encoding and transmission order from the TX 1010. In each reception of ordered code bit group(s), (e.g., for N'=8 and n'=3), and after calculation of LLR values from the received channel symbols, the decoder may select decoding procedure(s) for the code bit group(s) depending on its decoding method, such as low density parity code (LDPC)- like BP or standard BP decoding. For example, decoding may be performed in one iteration involving a half (right value) iteration plus a half (left value) iteration. In another example, decoding may be performed in one iteration involving half (variable to check) iteration plus half (check to variable) iteration in an LDPC-like BP iteration. In another example, decoding may involve multiple iterations, where for each reception of an ordered code bit group multiple iterations may be performed.

In BP decoding, each iteration may require 2n timing steps, and it follows then that I iterations may require 2nI timing steps in total. The scaling factor "2" in 2n and 2nI depicts two half-iterations corresponding to a left value calculation and a right value calculation as given in Eq. 3 to Eq. 6. For example, twelve (12=I) iterations may require $2\times10\times12=240$ timing steps for code length $N=2^{10}$. On the other hand, in LDPC-like BP decoding, only 2I timing steps may be required. Similarly, the scaling factor "2" in 2I depicts two half-iterations corresponding to variable node to check node calculation (e.g., left value calculation) and check node to variable node calculation (e.g., right value calculation).

As shown in FIG. 10, the timing relationship between conventional start decoding 1032 and early start decoding 1031 may be seen. If the iteration number is counted from the end of the code block reception and does not include the iterations from early decoding, the benefit of early start decoding may be evaluated. By adopting early start decoding, the decoder may finish its decoding process faster than the conventional BP decoding and hence a faster response (e.g., ACK/NACK response to the transmission) may be possible. It follows then this early decoding method may provide benefits for use cases, such as URLLC.

Figure 11:
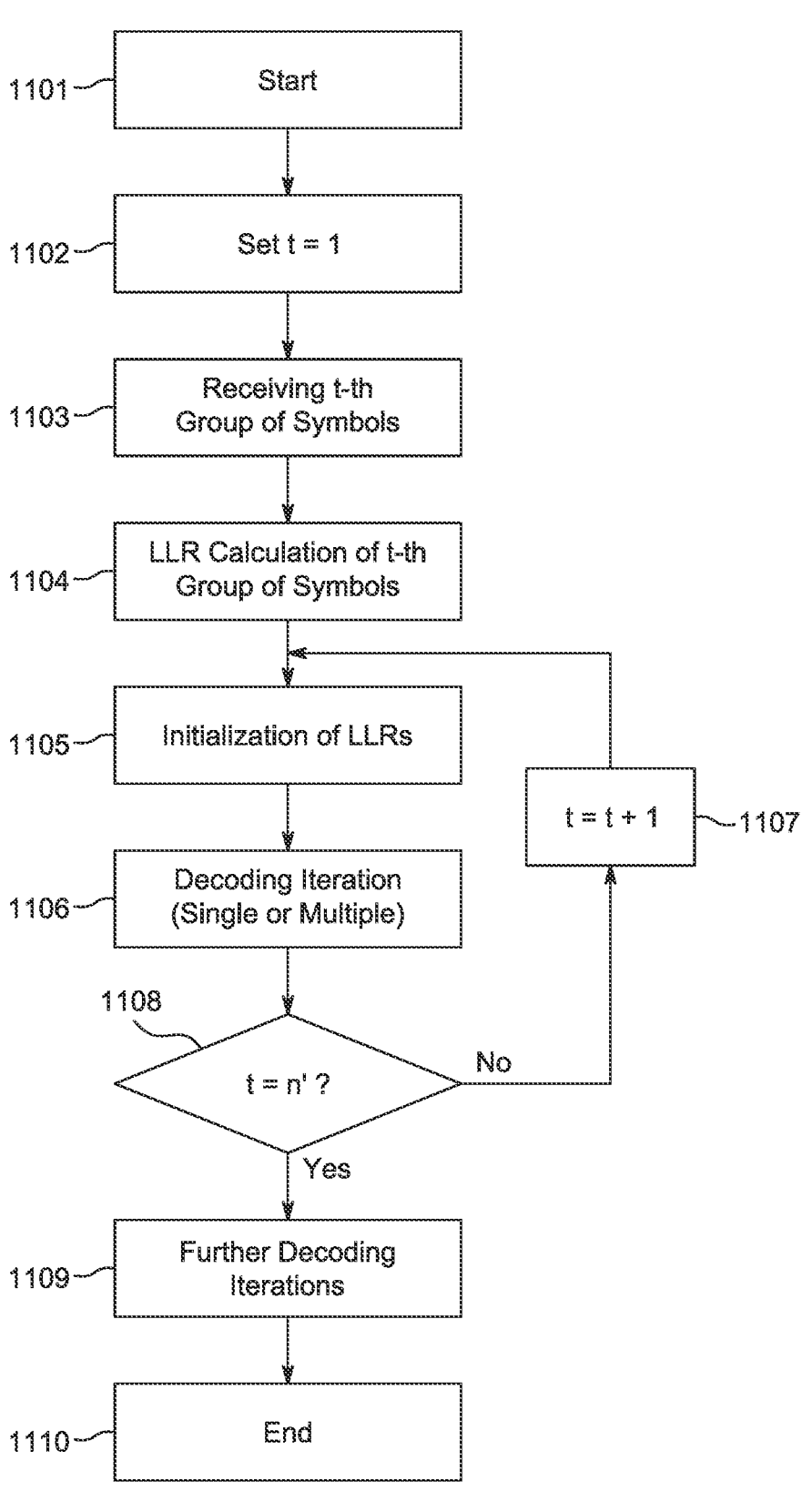
FIG. 11 is a flow chart illustrating an example decoding procedure.

FIG. 11 is a flow chart illustrating an example decoding procedure. Initially at 1101, the decoding process begins as part of the processing required for receiving a transmission. At this point t=1 as seen at 1102. At 1103, the ordered code bit groups (e.g., the "new groups" shown in the example of FIG. 9) that correspond to decoding step t are received. For each reception, at 1104 the decoder may calculate LLR values of channel symbols. At 1105, the corresponding nodes to the received group (the rightmost nodes in FIG. 2) may be initialized by the LLR values before decoding iteration(s). Once the LLRs are initialized, at 1106 decoding iteration(s) may be performed (e.g., early decoding), where the number of iterations may be a single (e.g., one) or multiple for each decoding step as described herein. The nodes that correspond to the code bit groups that have not been yet received are initialized to zero value. At 1108, t is assessed, and if t=n' is not reached then t is incremented at 1107 and returns to the process. But if t=n' is reached and all decoding steps by early decoding are completed, at 1109 the normal (conventional) decoding iterations as described above may be employed further to finish all decoding procedure to have final decoded bits (e.g., by incorporating the additional decoding iterations necessary to complete the decoding of the full code block). The decoding iteration may be continued until the predetermined maximum iteration. Instead of stopping by the maximum iteration limit, conditions to stop decoding early may be defined.

The length of component polar code N' may be determined based on a few considerations. The interleaving depth of the total interleaver 802 may be closely related to the performance under a burst error channel (e.g., fading channel). The adjacent code bits before interleaving may be separated with a distance of d after interleaving when the internal interleaving within the "new group" in FIG. 8 is done properly. The separated distance d may be larger than a specific value to overcome a burst error. N' may be closely related to d because N' is a basic separation between different code bit groups (e.g., CC1, CC2, . . . etc.; see for example encoded output code block 801) and need to be selected in consideration of d.

In the case of orthogonal transmissions in a frequency domain, such as OFDM, the time difference between the transmitted signals may be very small which would limit the applicability of the early start of decoding procedures. In order to provide a latency reduction benefit, the number of time units in a single transmission interval (corresponding to a polar coded block) should be equal or larger than n'. Thus, n' and corresponding N' may have upper bounds (e.g., "new group" corresponds to $$U_{i=1}^{N/N'} T_i^i),$$

such as a predetermined/configured threshold.

Within the time interval corresponding to the transmission of one "new group" in FIG. 9, at least one decoding iteration should be performed to facilitate the detailed early decoding procedures and benefit from the reduced latency. When n' is too small and the corresponding time interval for decoding by single received group may be too short, the decoder implementation may not perform even one iteration step. The decoder implementation capability to perform a single iteration may be one of factors that influence N'.

N' may have a range of its values influenced by the above considerations and may be determined to show the best error performance within the range. The error performance may be compared by simulation or real implementation.

As discussed herein, the transmitter and receiver may be any two devices, different or the same, as described herein, such as a WTRU. In one case, the transmitter may be a network node and the receiver may be a WTRU for data transmission by polar encoding, or the transmitter may be a WTRU and the network node may be the receiver. The receiver may send a signal indicating the capability of its polar decoder in the setup procedure of connection before the data transmission. The transmitter may decide the resource allocation indicating time interval for transmission and send the corresponding control information to the receiver before the data transmission. The control information/packet may be sent over any control channel (e.g., PDCCH) before a polar coded data transmission. The control information may contain the information indicating N' implicitly based on predetermined rules or contain this information explicitly. The receiver may need to decode the control information/packet to obtain the polar encoding/ decoding related information (e.g., N'). After the receiver receives the control information, the transmitter may transmit the data based on the control information. The receiver may have an early decoding procedure based on the frame format indicated by the received control information.

In one example, a polar code may be initially divided into multiple polar component codes. The features of these component codes (e.g., the number of component codes and/or the size of the component codes) may be determined based on parameters such as the number of available timing units within a transmission interval, interleaving depth, and/or decoder capability. For each selected component code, the order of code bit generation and their indexes may be determined. The determined indexes may then be assigned into different, unique groups according to the order of code bit generation. An interleaving operation may be configured and then executed according to the determined index grouping. In the transmission phase, the code bits may be transmitted based on the identified order of the bit generation in the component polar codes, such as determined index grouping. In a receiver, the decoder may start its decoding process of the received channel symbols utilizing the order of the transmission information made available to itself (e.g., via previously transmitted control information), and therefore the decoding process may already start before all channel symbols are received.

In one example, a device, such as a WTRU or a network node, may perform an operation for sending a packet that using polar encoding. Initially, the device may receive capability information from the receiver and determine time interval information based on the capability information of the receiver. The device may send control information to the receiver so that the receiver will be able to decode a future packet transmission. The encoding process may begin with receiving data from a higher layer for transmission. The data may be polar encoded. The device may then decompose the polar code into a plurality of component codes. The device may then group a code bit of a first component code with a code bit of a second component code based on a timing order of code bit generations by each component code, wherein the first component code and the second component code are part of the plurality of component codes. The device may then interleave each group of code bits and out the inter- leaved group(s) to a modulator which outputs a packet for transmission. The packet is transmitted to a receiver, where it is decoded based on control information received from the device prior to the transmission of the packet. The total count of the plurality of component codes is based on one or more of a number of available timing units within a trans- mission interval, an interleaving depth, and a decoder capa- bility. The length of each of the plurality of component codes is based on one or more of a number of available timing units within a transmission interval, an interleaving depth, and a decoder capability. The device may also determine an order of the code bits and index(es) for each component code as part of the encoding process.

In one example, a polar code may be initially divided into multiple polar component codes where the features of these component codes, such as the number of component codes and the size of the component codes, are determined based on parameters such as the number of available timing units within a transmission interval, interleaving depth, and decoder capability. For each selected component code, the order of code bit generation and their indexes may be determined. The determined indexes may be assigned into different, unique groups according to the order of code bit generation. An interleaving operation may be configured and then executed according to the determined index grouping. In the transmission phase, the code bits may be transmitted based on the identified order of the bit generation in the component polar codes, such as the determined index group- ing. In the receiver, the decoder may start its decoding process of the received channel symbols utilizing the order of the transmission information made available to itself a priori, and therefore the decoding process may star before receiving all channel symbols.

Example conditions for performing simulations to illus- trate the prospective advantages are provided in Table 1.

23

TABLE 1

Simulation Conditions

| Parameters | Values |
| --- | --- |
| N | 1024 |
| K | 512 |
| Code rate | ½ |
| CRC | No CRC |
| Decoding scheme | Flooding BP or LDPC like BP |
| Code construction | NR polar code sequence |
| Modulation | QPSK |
| Maximum iteration | Flooding BP = 60, LDPC like BP = 300 |
| Flooding BP | Scaled min sum round robin (0.9375) |
| Early decoding | Block based early decoding N' = 32 |
| Iterations for early timing step | Flooding BP = 1, LDPC like BP = 4 |
| Minimum counted error | 100 block errors |

Figure 12:
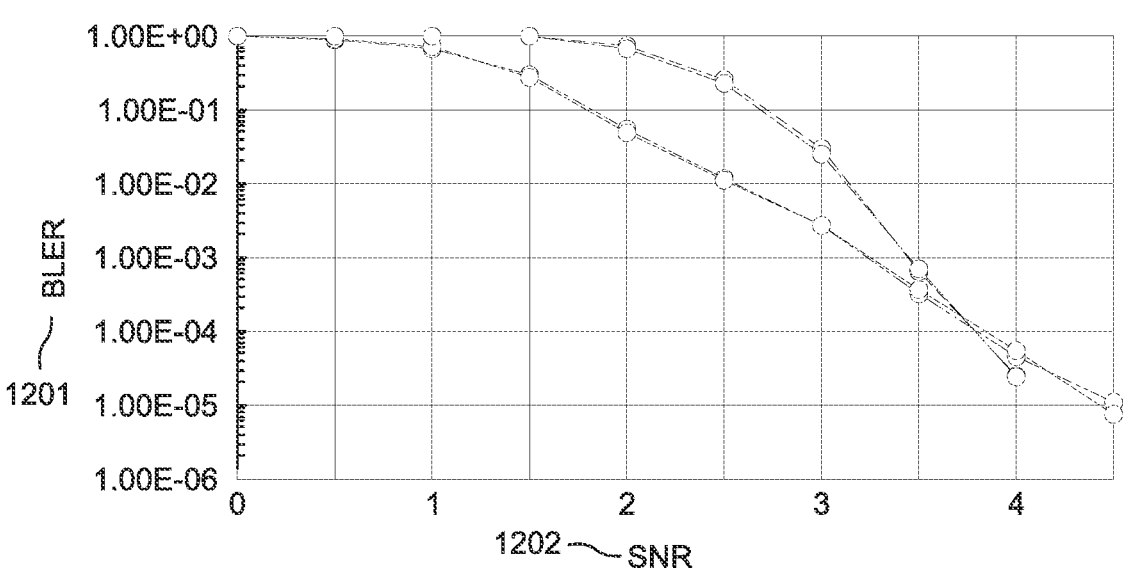
FIG. 12 is graph illustrating an example of a comparison of simulated block error performance between example procedures for conventional and early start decoding.
Figure 13:
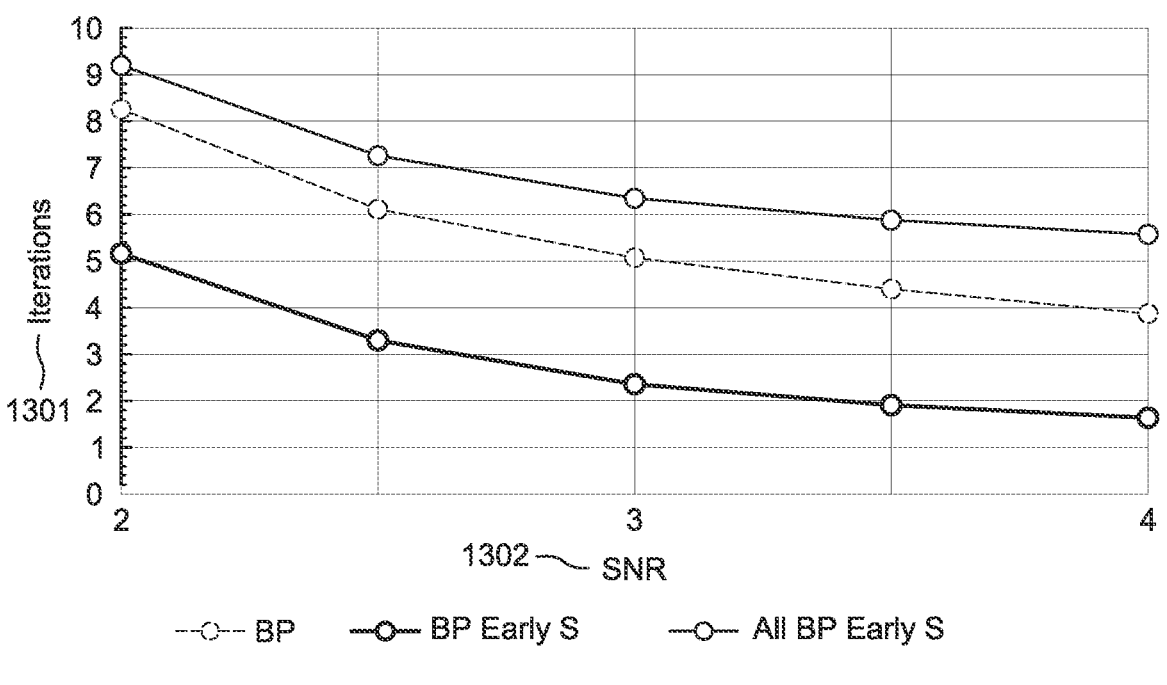
FIG. 13 is graph illustrating an example of a comparison of simulated timing steps between example procedures for conventional and early start BP decoding.
Figure 14:
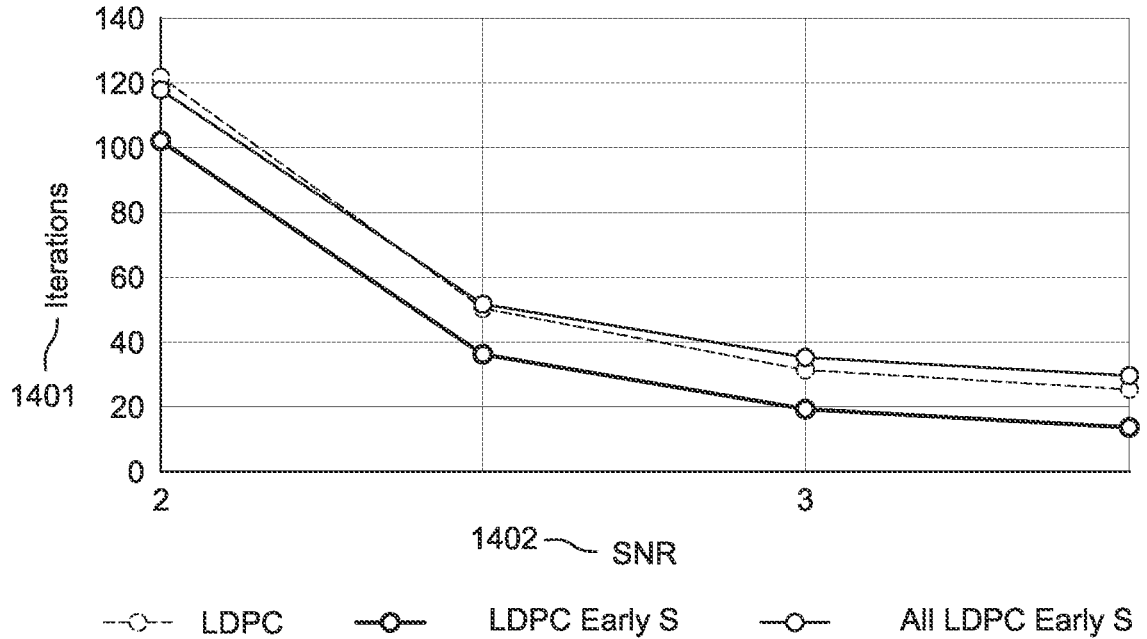
FIG. 14 is graph illustrating an example of is graph illustrating an example of a comparison of simulated timing steps between example procedures for conventional and early start LDPC-like BP decoding.

FIG. 12 is graph illustrating an example of a comparison of simulated block error performance between example procedures for conventional and early start decoding. FIG. 13 is graph illustrating an example of a comparison of simulated timing steps between example procedures for conventional and early start BP decoding; likewise, FIG. 14 is graph illustrating an example of a comparison of simulated timing steps between example procedures for conventional and early start LDPC-like BP decoding.

For purposes of the present simulations, LDPC like BP decoding may be modified based on polar decomposition. The length of component polar code for early start decoding may be N'=32. One iteration may be assumed for each early BP decoding of ordered group and four iterations may be assumed for each early LDPC like BP decoding of ordered group. In the simulations, the component polar code with N'=32 may be used for ordered group selection and the cases of FIG. 5 501 and 502 may also be assumed. The order of code bit generation by the encoding method based on the sparse parity check matrix may be assumed, and may provide a different generation order of code bits from the encoder of a conventional NR approach.

From the results shown in FIG. 12, no performance difference between conventional decoding and early start decoding may be observed. From the result of FIG. 13, 58.9% of iterations at SNR=4 dB may be reduced by early start decoding but 44.6% of iterations may be increased at SNR=4 dB by early start decoding. From the result of FIG. 14, 45.9% of iterations at SNR=4 dB may be reduced by early start decoding but 14.2% of iterations at is increased at SNR=4 dB by early start decoding.

The disclosed operations in the encoder may result in modifying the order of encoded bit streams, which may be identified by comparing such bit-stream produced by the other encoding method of transmissions. Moreover, the details of operation employed for ordering of encoding may be determined by investigating various test input (e.g., uncoded) bit streams and their corresponding encoded bit stream outcomes.

Also, as detailed herein, the polar decoding operation may require modification based on the disclosed ordering operations. Therefore, in order to allow inter-compatibility, the procedures in the ordering of encoding may be disclosed and agreed-on, which may provide the relevant modifications in the decoder.

Although features and elements are described above in particular combinations, one of ordinary skill in the art will appreciate that each feature or element may be used alone or in any combination with the other features and elements. In addition, the methods described herein may be implemented in a computer program, software, or firmware incorporated in a computer-readable medium for execution by a computer or processor. Examples of computer-readable media include electronic signals (transmitted over wired or wireless connections) and computer-readable storage media. Examples of computer-readable storage media include, but are not limited to, a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs). A processor in association with software may be used to implement a radio frequency transceiver for use in a WTRU, UE, terminal, base station, RNC, or any host computer.

What is claimed:

1. A method comprising:
decomposing a code into a plurality of component codes, wherein each of the plurality of component codes has a reduced block length compared to the code, wherein the plurality of component codes includes a first component code and a second component code;
generating a group of code bits by grouping a code bit of the first component code with a code bit of the second component code based on a respective index of the code bit of the first component code and of the code bit of the second component code;
interleaving the group of code bits; and
transmitting a transmission that includes the group of code bits to a receiver.

2. The method of claim 1, further comprising:
receiving capability information of the receiver;
determining time interval information based on the capability information of the receiver; and
sending control information to the receiver prior to transmitting the transmission, wherein the control information includes time interval information.

3. The method of claim 1, wherein the method is performed by a wireless transmit receive unit (WTRU) or a base station.

4. The method of claim 1, wherein the code bit of the first component code and the code bit of the second component code have a same index.

5. The method of claim 1, wherein the grouping is further based on a timing order of code bit generations of each component code.

6. The method of claim 1, wherein the reduced block length of each of the plurality of component codes is the same.

7. The method of claim 1, wherein the interleaving of the group of code bits comprises interleaving all code bits within the group of code bits or interleaving the group of code bits with one or more code bits in at least one other group of code bits.

8. The method of claim 1, wherein the interleaving of the group of code bits comprises interleaving the group of code bits at a group level with at least one other group of code bits.

9. A device comprising:
a transceiver and a processor, the transceiver and processor configured to decompose a code into a plurality of component codes, wherein each of the plurality of component codes has a reduced block length compared to the code, wherein the plurality of component codes includes a first component code and a second component code;

the transceiver and processor configured to generate a group of code bits by grouping a code bit of the first component code with a code bit of the second component code based on a respective index of the code bit of the first component code and of the code bit of the second component code;

the transceiver and processor configured to interleave the group of code bits; and the transceiver and processor configured to transmit a transmission that includes the group of code bits to a receiver.

10. The device of claim 9, wherein:

the transceiver and processor configured to receive capability information of the receiver;

the transceiver and processor configured to determine time interval information based on the capability information of the receiver; and the transceiver and processor configured to send control information to the receiver prior to transmitting the transmission, wherein the control information includes time interval information.

11. The device of claim 9, wherein the device is a wireless transmit receive unit (WTRU) or a base station.

12. The device of claim 9, wherein the code bit of the first component code and the code bit of the second component code have a same index.

13. The device of claim 9, wherein the grouping is further based on a timing order of code bit generations of each component code.

14. The device of claim 9, wherein the reduced block length of each of the plurality of component codes is the same.

15. The device of claim 9, wherein the interleaving of the group of code bits comprises interleaving all code bits within the group of code bits or interleaving the group of code bits with one or more code bits in at least one other group of code bits.

16. The device of claim 9, wherein the interleaving of the group of code bits comprises interleaving the group of code bits at a group level with at least one other group of code bits.

\* \* \* \* \*